US008233323B2

(12) United States Patent
Hishida et al.

(10) Patent No.: US 8,233,323 B2
(45) Date of Patent: Jul. 31, 2012

(54) NON-VOLATILE SEMICONDUCTOR STORAGE DEVICE

(75) Inventors: Tomoo Hishida, Yokohama (JP);
Yoshihisa Iwata, Yokohama (JP);
Kiyotaro Itagaki, Yokohama (JP);
Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 317 days.

(21) Appl. No.: 12/694,690

(22) Filed: Jan. 27, 2010

(65) Prior Publication Data
US 2010/0214838 A1 Aug. 26, 2010

(30) Foreign Application Priority Data

Feb. 24, 2009 (JP) ................................. 2009-041157

(51) Int. Cl.
*G11C 16/04* (2006.01)
(52) U.S. Cl. ................ 365/185.11; 365/63; 365/185.29; 365/185.17; 365/185.05; 365/185.12; 257/324; 257/326; 257/331; 257/202
(58) Field of Classification Search ............. 365/185.11, 365/63, 185.29, 185.17, 185.05, 185.12; 257/324, 326, 331, 202
See application file for complete search history.

(56) References Cited

U.S. PATENT DOCUMENTS

| 6,160,297 | A  | * | 12/2000 | Shimizu et al. | ............... | 257/390 |
| 6,353,242 | B1 | * | 3/2002 | Watanabe et al. | ............. | 257/316 |
| 6,512,253 | B2 | * | 1/2003 | Watanabe et al. | ............. | 257/208 |
| 6,611,010 | B2 | * | 8/2003 | Goda et al. | .................... | 257/210 |
| 6,925,008 | B2 | * | 8/2005 | Ichige et al. | ............. | 365/185.17 |
| 7,049,652 | B2 | * | 5/2006 | Mokhlesi et al. | ............. | 257/315 |
| 7,061,802 | B2 | * | 6/2006 | Nakai | ........................ | 365/185.13 |
| 7,145,199 | B2 | * | 12/2006 | Kajimoto et al. | ............. | 257/314 |
| 7,250,646 | B2 | * | 7/2007 | Walker et al. | .................. | 257/278 |
| 7,411,826 | B2 | * | 8/2008 | Ichige et al. | ............. | 365/185.17 |
| 7,432,561 | B2 | * | 10/2008 | Mizukami et al. | ............ | 257/390 |
| 7,459,748 | B2 | * | 12/2008 | Shirota et al. | .................. | 257/314 |
| 7,539,056 | B2 | * | 5/2009 | Katsumata et al. | ...... | 365/185.18 |
| 7,553,728 | B2 | * | 6/2009 | Mizukami et al. | ............ | 438/257 |
| 7,623,384 | B2 |   | 11/2009 | Iwata |  |  |
| 7,649,777 | B2 | * | 1/2010 | Ichige et al. | ............. | 365/185.17 |

(Continued)

FOREIGN PATENT DOCUMENTS

JP 2845843 10/1998

(Continued)

OTHER PUBLICATIONS

U.S. Appl. No. 12/886,874, filed Sep. 21, 2010, Iwata.
H. Tanaka, et al., "Bit Cost Scalable Technology with Punch and Plug Process for Ultra High Density Flash Memory", 2007 Symposium on VLSI Technology Digest of Technical Papers, Jun. 2007, pp. 14-15.

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

A non-volatile semiconductor storage device includes a control circuit performing an erase operation to erase data from a selected one of memory transistors. The control circuit applies a first voltage to the other end of selected one of selection transistors, causes the selected one of the selection transistors to turn on, and causes any one of the memory transistors to turn on that is closer to the selection transistor than the selected one of the memory transistors. The control circuit also applies a second voltage lower than the first voltage to a gate of the selected one of the memory transistors. Such a potential difference between the first voltage and the second voltage causing a change in electric charges in the electric charge storage layer.

11 Claims, 29 Drawing Sheets

U.S. PATENT DOCUMENTS

| | | | |
|---|---|---|---|
| 7,714,377 B2 * | 5/2010 | Specht et al. | 257/316 |
| 7,821,058 B2 * | 10/2010 | Kidoh et al. | 257/324 |
| 7,829,930 B2 * | 11/2010 | Terao et al. | 257/314 |
| 7,910,979 B2 * | 3/2011 | Matsuoka et al. | 257/324 |
| 7,969,559 B2 * | 6/2011 | Luo et al. | 356/5.1 |
| 8,013,389 B2 * | 9/2011 | Oh et al. | 257/331 |
| 8,044,448 B2 * | 10/2011 | Kamigaichi et al. | 257/296 |
| 8,053,829 B2 * | 11/2011 | Kang et al. | 257/326 |
| 8,097,504 B2 * | 1/2012 | Mokhlesi et al. | 438/257 |
| 2007/0252201 A1 | 11/2007 | Kito et al. | |

FOREIGN PATENT DOCUMENTS

| | | |
|---|---|---|
| JP | 2007-266143 | 10/2007 |
| WO | WO 2009/075370 A1 | 6/2009 |

OTHER PUBLICATIONS

Yoshiaki Fukuzumi, et al., "Optimal Integration and Characteristics of Vertical Array Devices for Ultra-High Density, Bit-Cost Scalable Flash Memory", IEDM 2007, Dec. 2007, pp. 449-452.

Yasuo Itoh, et al., "An Experimental 4Mb CMOS EEPROM with a NAND Structured Cell", 1989 IEEE International Solid State Circuits Conference, Feb. 1989, 3 pages.

Satyen Mukherjee, et al., "A Single Transistor EEPROM Cell and Its Implementation in a 512K CMOS EEPROM", IEDM Tech. Digest, 1985, pp. 616-619.

U.S. Appl. No. 12/679,991, filed Mar. 25, 2010, Fukuzumi et al.

\* cited by examiner

FIG. 7

| | Selected Row s-row | | Unselected Row ns-row | |
|---|---|---|---|---|
| | Selected Block s-MB | Unselected Block ns-MB | Selected Block s-MB | Unselected Block ns-MB |
| Bit Line BL | 0 → Vera1 | | 0 → Vera3 | |
| Drain-Side Selection Gate Line SGD | 0 → Vera2 | 0 | 0 → Vera2 | 0 |
| Word Line WL4 | 0 → Vera2 | 0 | 0 → Vera2 | 0 |
| Word Line WL3 | 0 | 0 | 0 | 0 |
| Word Line WL2 | 0 | 0 | 0 | 0 |
| Word Line WL1 | 0 | 0 | 0 | 0 |
| Source-Side Selection Gate Line SGS | 0 | 0 | 0 | 0 |
| Source Line SL | 0 | | 0 | | e.g., $\begin{bmatrix} \text{Vera1}=20\text{V} \\ \text{Vera2}=22\text{V} \\ \text{Vera3}=11\text{V} \end{bmatrix}$

FIG. 14

| | Selected Row s-row | | | Unselected Row ns-row | | |
|---|---|---|---|---|---|---|
| | Selected Block s-MBa | | Unselected Block ns-MBa | Selected Block s-MBa | | Unselected Block ns-MBa |
| | Selected Colum s-col | Unselected Column ns-col | | Selected Colum s-col | Unselected Column ns-col | |
| Bit Line BL | 0→Vera1 | | 0 | 0→Vera3 | | 0 |
| Drain-Side Selection Gate Line SGD | 0→Vera2 | 0→Vera4 | 0 | 0→Vera2 | 0→Vera4 | 0 |
| Word Line WLa4 | 0→Vera2 | | 0 | 0→Vera2 | | 0 |
| Word Line WLa3 | 0 | 0 | 0 | 0 | 0 | 0 |
| Word Line WLa2 | 0 | 0 | 0 | 0 | 0 | 0 |
| Word Line WLa1 | 0 | 0 | 0 | 0 | 0 | 0 |
| Source-Side Selection Gate Line SGS | 0 | | | 0 | | |
| Source Line SL | 0 | | | 0 | | | e.g.,
Vera1=20V
Vera2=22V
Vera3=11V
Vera4=13V

FIG. 18

| | Selected Row s-row | | Unselected Row ns-row | |
|---|---|---|---|---|
| | Selected Block s-MBb | Unselected Block ns-MBb | Selected Block s-MBb | Unselected Block ns-MBb |
| Bit Line BL | (1) 0 → Vera1 | | (3) 0 → Vera8 | |
| Drain-Side Selection Gate Line SGD | (2) 0 → Vera5 | (2) 0 → Vera5 | (2) 0 → Vera5 | (2) 0 → Vera5 |
| Word Line WL4 | (3) 0 → Vera1 | (3) 0 → Vera1 | (3) 0 → Vera1 | (3) 0 → Vera1 |
| Word Line WL3 | 0 | (3) 0 → Vera1 | 0 | (3) 0 → Vera1 |
| Word Line WL2 | (3) 0 → Vera1 | (3) 0 → Vera1 | (3) 0 → Vera1 | (3) 0 → Vera1 |
| Word Line WL1 | (3) 0 → Vera1 | (3) 0 → Vera1 | (3) 0 → Vera1 | (3) 0 → Vera1 |
| Source-Side Selection Gate Line SGS | (3) 0 → Vera8 | (3) 0 → Vera8 | (3) 0 → Vera8 | (3) 0 → Vera8 |
| Source Line SL | (3) 0 → Vera8 | | (3) 0 → Vera8 | | e.g., Vera1=20V
Vera5=15V
Vera8=10V (1) for time t31 of FIG. 19
(2) for time t32 of FIG. 19
(3) for time t33 of FIG. 19

FIG. 20

|  | Selected Row s-row | | Unselected Row ns-row | | |
|---|---|---|---|---|---|
|  | Selected Block s-MBb | Unselected Block ns-MBb | Selected Block s-MBb | Unselected Block ns-MBb | |
| Bit Line BL | (1) 0 → Vera1 | | (3) 0 → Vera8 | | |
| Drain-Side Selection Gate Line SGD | (2) 0 → Vera5 | (2) 0 → Vera5 | (2) 0 → Vera5 | (2) 0 → Vera5 | |
| Word Line WL4 | (3) 0 → Vera1 | (3) 0 → Vera9 | (3) 0 → Vera1 | (3) 0 → Vera9 | |
| Word Line WL3 | 0 | (3) 0 → Vera9 | 0 | (3) 0 → Vera9 | |
| Word Line WL2 | (3) 0 → Vera1 | (3) 0 → Vera9 | (3) 0 → Vera1 | (3) 0 → Vera9 | |
| Word Line WL1 | (3) 0 → Vera1 | (3) 0 → Vera9 | (3) 0 → Vera1 | (3) 0 → Vera9 | |
| Source-Side Selection Gate Line SGS | (3) 0 → Vera8 | (3) 0 → Vera8 | (3) 0 → Vera8 | (3) 0 → Vera8 | |
| Source Line SL | (3) 0 → Vera8 | | (3) 0 → Vera8 | | | e.g.,
Vera1=20V
Vera5=15V
Vera8=10V
Vera9=12V (1) for time t31 of FIG. 19
(2) for time t32 of FIG. 19
(3) for time t33 of FIG. 19

FIG. 21

| | Selected Row s-row | | Unselected Row ns-row | |
|---|---|---|---|---|
| | Selected Block s-MBb | Unselected Block ns-MBb | Selected Block s-MBb | Unselected Block ns-MBb |
| Bit Line BL | (1) 0 → Vera1 | | | (3) 0 → Vera8 |
| Drain-Side Selection Gate Line SGD | (2) 0 → Vera5 | (2) 0 → Vera5 | (2) 0 → Vera5 | (2) 0 → Vera5 |
| Word Line WL4 | (3) 0 → Vera1 | (3) 0 → Vera10 | (3) 0 → Vera1 | (3) 0 → Vera10 |
| Word Line WL3 | 0 | (3) 0 → Vera10 | 0 | (3) 0 → Vera10 |
| Word Line WL2 | (3) 0 → Vera1 | (3) 0 → Vera10 | (3) 0 → Vera1 | (3) 0 → Vera10 |
| Word Line WL1 | (3) 0 → Vera1 | (3) 0 → Vera10 | (3) 0 → Vera1 | (3) 0 → Vera10 |
| Source-Side Selection Gate Line SGS | (3) 0 → Vera8 | (3) 0 → Vera8 | (3) 0 → Vera8 | (3) 0 → Vera8 |
| Source Line SL | (3) 0 → Vera8 | | | (3) 0 → Vera8 | e.g.,  Vera1=20V
       Vera5=15V
       Vera8=11V
       Vera10=15V (1) for time t31 of FIG. 19
(2) for time t32 of FIG. 19
(3) for time t33 of FIG. 19

FIG. 25

| | Selected Row s-row | | | Unselected Row ns-row | | |
|---|---|---|---|---|---|---|
| | Selected Block s-MBc | | Unselected Block ns-MBc | Selected Block s-MBc | | Unselected Block ns-MBc |
| | Selected Colum s-col | Unselected Column ns-col | | Selected Colum s-col | Unselected Column ns-col | |
| Bit Line BL | (2) 0 → Vera1 | | | (4) 0 → Vera8 | | |
| Drain-Side Selection Gate Line SGD | (3) 0 → Vera5 | (1) 0 → Vera7 | (3) 0 → Vera5 | (3) 0 → Vera5 | (1) 0 → Vera7 | (3) 0 → Vera5 |
| Word Line WLa4 | (4) 0 → Vera8 | 0 | (4) 0 → Vera1 | (4) 0 → Vera8 | 0 | (4) 0 → Vera1 |
| Word Line WLa3 | 0 | 0 | (4) 0 → Vera1 | (4) 0 → Vera8 | 0 | (4) 0 → Vera1 |
| Word Line WLa2 | (4) 0 → Vera8 | (4) 0 → Vera8 | (4) 0 → Vera1 | (4) 0 → Vera8 | (4) 0 → Vera8 | (4) 0 → Vera1 |
| Word Line WLa1 | (4) 0 → Vera8 | (4) 0 → Vera8 | (4) 0 → Vera1 | (4) 0 → Vera8 | (4) 0 → Vera8 | (4) 0 → Vera1 |
| Source-Side Selection Gate Line SGS | (4) 0 → Vera8 | (4) 0 → Vera8 | (4) 0 → Vera8 | (4) 0 → Vera8 | (4) 0 → Vera8 | (4) 0 → Vera8 |
| Source Line SL | (4) 0 → Vera8 | | | | | | e.g.,
Vera1=20V
Vera5=15V
Vera8=11V
Vera7=18V (1) for time t41 of FIG. 26
(2) for time t42 of FIG. 26
(3) for time t43 of FIG. 26
(4) for time t44 of FIG. 26

NON-VOLATILE SEMICONDUCTOR STORAGE DEVICE

CROSS-REFERENCE TO RELATED APPLICATIONS

This application is based upon and claims the benefit of priority from the prior Japanese Patent Application No. 2009-41157, filed on Feb. 24, 2009, the entire contents of which are incorporated herein by reference.

BACKGROUND OF THE INVENTION

1. Field of the Invention

The present invention relates to an electrically rewritable non-volatile semiconductor storage device.

2. Description of the Related Art

As refinement technologies are pushed to the limit for improving the bit density of non-volatile semiconductor storage devices such as NAND type flash memory, there is increasing demand for lamination of memory cells. As one example, there have been proposed lamination-type non-volatile semiconductor storage devices where memory cells are configured with vertical transistors (see, for example, Japanese Patent Laid-Open No. 2007-266143). The lamination-type non-volatile semiconductor storage device comprises a plurality of memory blocks each configuring an erase unit. Each memory block has memory strings, each of which has a plurality of memory cells connected in series. Each memory string has a columnar semiconductor layer, a MONOS layer formed to surround the columnar semiconductor layer, and a conductive layer formed to surround the MONOS layer.

Conventionally, in the above-mentioned non-volatile semiconductor storage device, an erase operation is performed per memory block. That is, in the erase operation, all data is first erased from each memory block, and any data that does not need to be erased is written back to the memory block. As such, this erase operation requires write-back of data, which can be time-consuming.

SUMMARY OF THE INVENTION

One aspect of the present invention provides a non-volatile semiconductor storage device comprising: a plurality of memory strings each including a plurality of memory transistors connected in series; a plurality of selection transistors each having one end connected to one end of a respective one of the memory strings, each of the selection transistors being conductive when selecting one of the memory strings; and a control circuit performing an erase operation to erase data from a selected one of the memory transistors included in the selected one of the memory strings connected to one end of a selected one of the selection transistors, each of the memory strings comprising: a first semiconductor layer having a columnar portion extending in a vertical direction to a substrate, and functioning as a body of each of the plurality of memory transistors; an electric charge storage layer surrounding the first semiconductor layer; and a first conductive layer surrounding the electric charge storage layer and extending in parallel to the substrate, the first conductive layer functioning as a gate of each of the plurality of memory transistors, each of the selection transistors comprising: a second semiconductor layer in contact with a top surface of the columnar portion and extending in the vertical direction to the substrate, the second semiconductor layer functioning as a body of the selection transistor; a gate insulation layer surrounding the second semiconductor layer; and a second conductive layer surrounding the gate insulation layer and extending in parallel to the substrate, the second conductive layer functioning as a gate of the selection transistor, the control circuit applying a first voltage to the other end of the selected one of the selection transistors, causing the selected one of the selection transistors to turn on, and causing any one of the memory transistors to turn on that is closer to the selection transistor than the selected one of the memory transistors, and also applying a second voltage lower than the first voltage to the gate of the selected one of the memory transistors, and such a potential difference between the first voltage and the second voltage causing a change in electric charges in the electric charge storage layer.

Another aspect of the present invention provides a non-volatile semiconductor storage device comprising: a plurality of memory strings each including a plurality of memory transistors connected in series; a plurality of first selection transistors each having one end connected to one end of a respective one of the memory strings, each of the first selection transistors being conductive when selecting one of the memory strings; a plurality of second selection transistors each having one end connected to the other end of a respective one of the memory strings, each of the second selection transistors being conductive when selecting one of the memory strings; and a control circuit performing an erase operation to erase data from a selected one of the memory transistors included in the selected one of the memory strings connected to one end of a selected one of the first selection transistors, each of the memory strings comprising: a first semiconductor layer having a columnar portion extending in a vertical direction to a substrate, and functioning as a body of each of the plurality of memory transistors; an electric charge storage layer surrounding the first semiconductor layer; and a first conductive layer surrounding the electric charge storage layer and extending in parallel to the substrate, the first conductive layer functioning as a gate of each of the plurality of memory transistors, each of the first selection transistors comprising: a second semiconductor layer in contact with one end of the columnar portion and extending in the vertical direction to the substrate, the second semiconductor layer functioning as a body of the first selection transistor; a first gate insulation layer surrounding the second semiconductor layer; and a second conductive layer surrounding the first gate insulation layer and extending in parallel to the substrate, the second conductive layer functioning as a gate of the first selection transistor, each of the second selection transistors comprising: a third semiconductor layer in contact with the other end of the columnar portion and extending in the vertical direction to the substrate, the third semiconductor layer functioning as a body of the second selection transistor; a second gate insulation layer surrounding the third semiconductor layer; and a third conductive layer surrounding the second gate insulation layer and extending in parallel to the substrate, the third conductive layer functioning as a gate of the second selection transistor, the second semiconductor layer having a p-type layer in contact with one end of the columnar portion, and an n-type layer located on the p-type layer, the third semiconductor layer having an n-type layer in contact with the other end of the columnar portion, a p-type layer located below the n-type layer, and another n-type layer located below the p-type layer, the control circuit applying a first voltage to the other end of the selected one of the first selection transistors, then applying a second voltage to the gate of the selected one of the first selection transistors, and then causing the memory transistors other than the selected memory transistor to turn on, and also applying a third voltage to the gate of the selected memory transistor, such a potential difference between the first voltage and the second voltage causing a first current flowing from the n-type layer of the second semiconductor layer located near the first gate insulation layer into the p-type layer of the second semiconductor layer, and such a potential difference between the first voltage and the third voltage causing holes generated by the first current to be injected into the electric charge storage layer of the selected memory transistor.

BRIEF DESCRIPTION OF THE DRAWINGS

FIG. 7 illustrates the voltages applied during the erase operation of the non-volatile semiconductor storage device according to the first embodiment;

FIG. 14 illustrates the voltages applied during the erase operation of the non-volatile semiconductor storage device according to the second embodiment;

FIG. 18 illustrates the voltages applied during the erase operation of the non-volatile semiconductor storage device according to the third embodiment;

FIG. 20 illustrates the voltages applied during the erase operation of a non-volatile semiconductor storage device according to a fourth embodiment;

FIG. 21 illustrates the voltages applied during the erase operation of a non-volatile semiconductor storage device according to a fifth embodiment;

FIG. 25 illustrates the voltages applied during the erase operation of the non-volatile semiconductor storage device according to the sixth embodiment;

DETAILED DESCRIPTION OF THE EMBODIMENTS

Embodiments of a non-volatile semiconductor storage device according to the present invention will now be described below with reference to the accompanying drawings.

First Embodiment

[Circuit Configuration of Non-Volatile Semiconductor Storage Device in First Embodiment]

Referring first to FIGS. 1 to 3B, a circuit configuration of a non-volatile semiconductor storage device according to a first embodiment will be described below.

Figure 1:
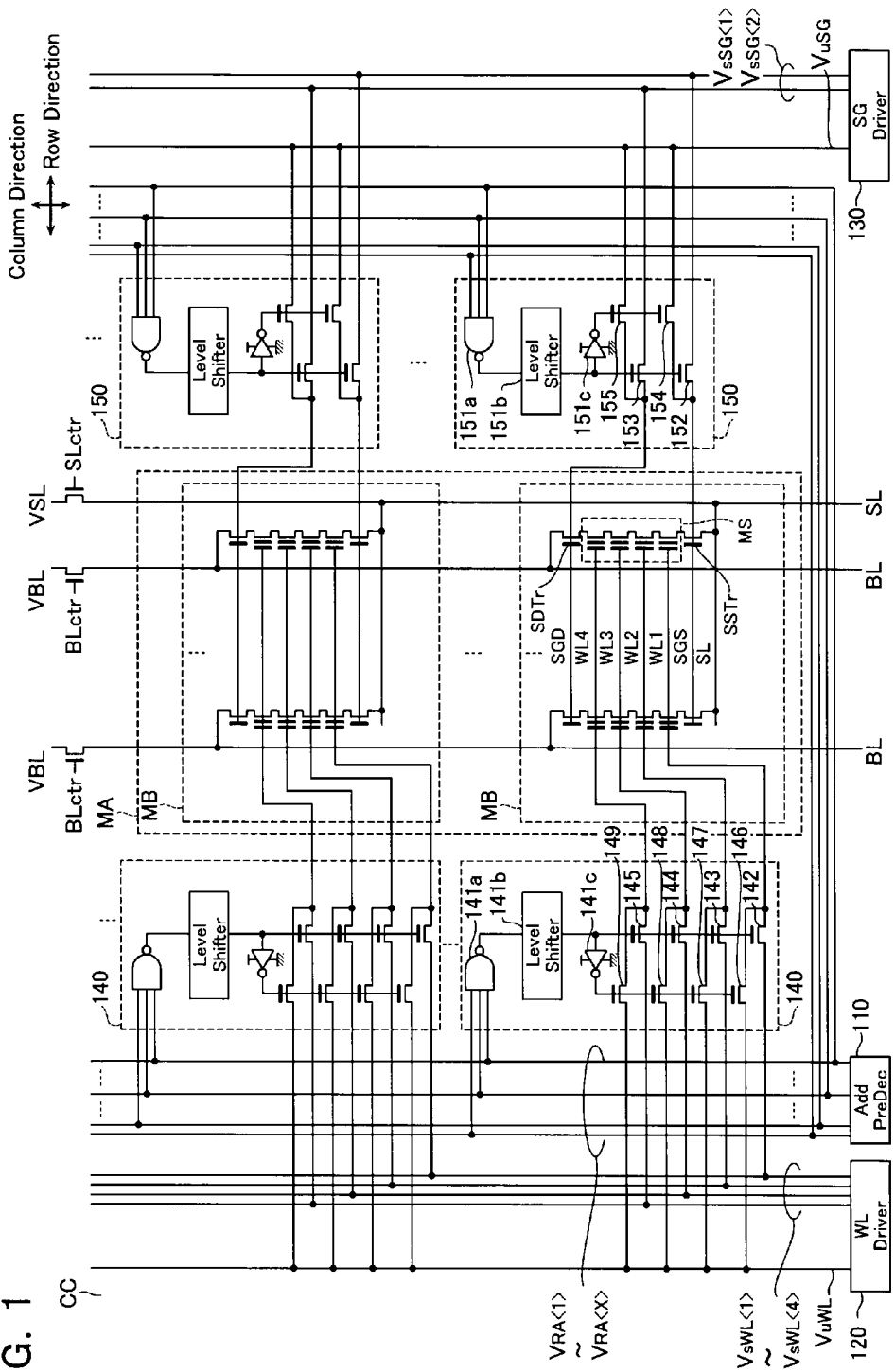
FIG. 1 is a circuit diagram of a non-volatile semiconductor storage device according to a first embodiment of the present invention.

FIG. 1 is a circuit diagram of the non-volatile semiconductor storage device according to the first embodiment. As illustrated in FIG. 1, the non-volatile semiconductor storage device of the first embodiment comprises a memory cell array MA that stores data, and a control circuit CC that is provided on the periphery thereof and controls the memory cell array MA.

Figure 2:
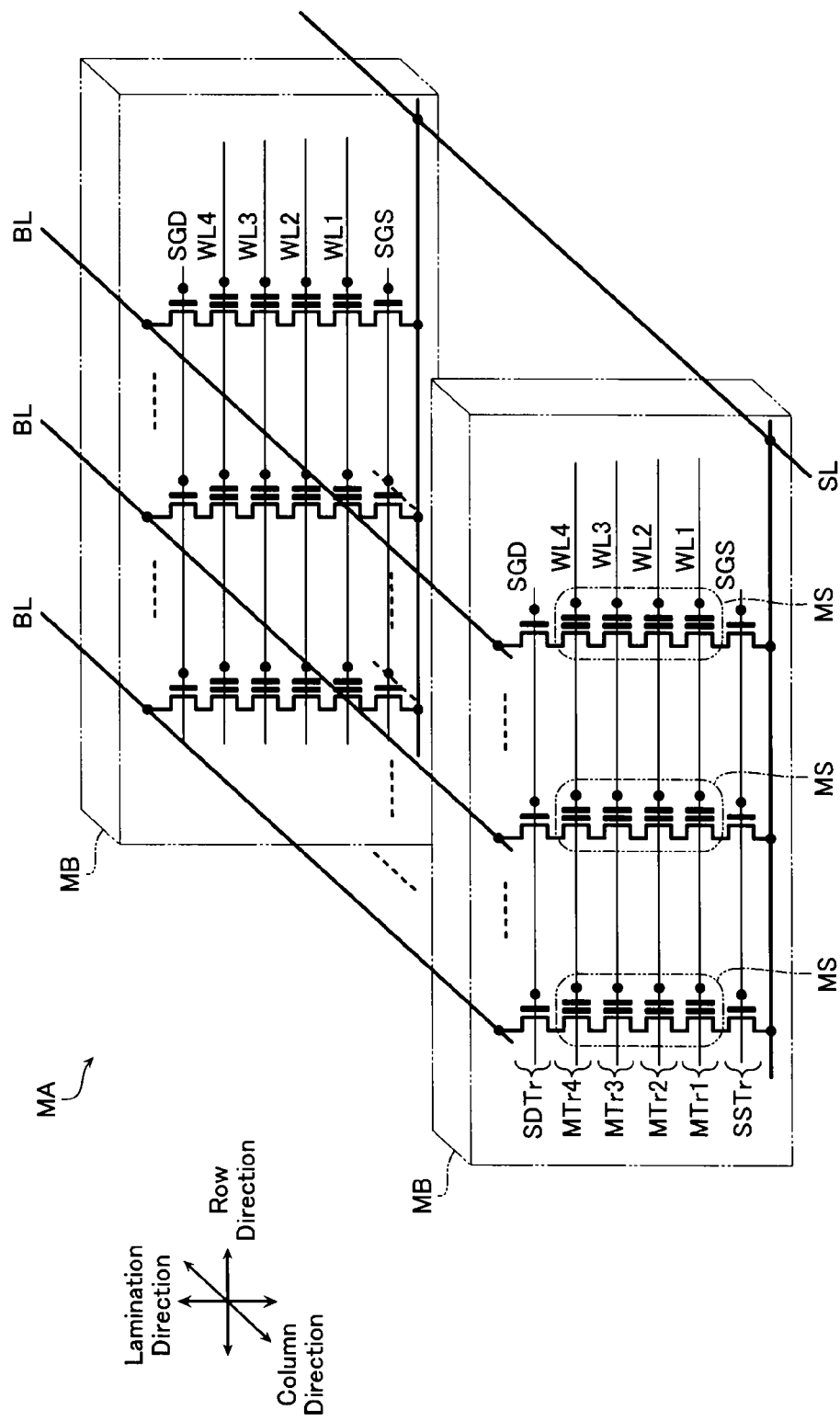
FIG. 2 is a circuit diagram of one memory cell array MA according to the first embodiment.

FIG. 2 is a circuit diagram of one memory cell array MA. As illustrated in FIGS. 1 and 2, the memory cell array MA has a plurality of memory blocks MB aligned in the column direction.

As illustrated in FIGS. 1 and 2, each memory block MB has memory strings MS, drain-side selection transistors SDTr, and source-side selection transistors SSTr that are aligned in the row direction, respectively. The drain-side selection transistors SDTr and the source-side selection transistors SSTr include high breakdown voltage MOS transistors since a high voltage is applied between their sources and drains, as described below.

As illustrated in FIGS. 1 and 2, each memory string MS has electrically rewritable memory transistors MTr1 to MTr4. The gates of the memory transistors MTr1 to MTr4 include MONOS structures. The memory transistors MTr1 to MTr4 use the electric charges accumulated in the electric charge storage layers to store information. The memory transistors MTr1 to MTr4 are connected in series. The gates of the memory transistors MTr1 to MTr4 are connected to word lines WL1 to WL4, respectively.

As illustrated in FIG. 2, the word lines WL1 to WL4 are formed to extend in the row direction at a certain pitch in the column direction. Each word line WL1 is commonly connected to the gates of those memory transistors MTr1 that are aligned in the row direction. Each word line WL2 is commonly connected to the gates of those memory transistors MTr2 that are aligned in the row direction. Each word line WL3 is commonly connected to the gates of those memory transistors MTr3 that are aligned in the row direction. Each word line WL4 is commonly connected to the gates of those memory transistors MTr4 that are aligned in the row direction.

As illustrated in FIGS. 1 and 2, each source-side selection transistor SSTr has one end connected to one end of a respective memory string MS (one end of a respective memory transistor MTr1). Each source-side selection transistor SSTr has a gate connected to a respective source-side selection gate line SGS. Each source-side selection transistor SSTr has the other end connected to a source line SL.

As illustrated in FIG. 2, the source-side selection gate lines SGS are formed to extend in the row direction at a certain pitch in the column direction. Each source-side selection gate line SGS are commonly connected to the gates of those source-side selection transistors SSTr that are aligned in the row direction. The source line SL is commonly connected to the other ends of the source-side selection transistors SSTr included in all memory blocks MB.

As illustrated in FIGS. 1 and 2, each drain-side selection transistor SDTr has one end connected to the other end of a respective memory string MS (one end of a respective memory transistor MTr4). Each drain-side selection transistor SDTr has a gate connected to a respective drain-side selection gate line SGD. Each drain-side selection transistor SDTr has the other end connected to a respective bit line BL.

As illustrated in FIG. 2, the drain-side selection gate lines SGD are formed to extend in the row direction at a certain pitch in the column direction. Each drain-side selection gate line SGD is commonly connected to the gates of those drain-side selection transistors SDTr that are aligned in the row direction. The bit lines BL are formed to extend in the column direction at a certain pitch in the row direction. Each bit line BL is commonly connected to the other ends of those drain-side selection transistors SDTr that are aligned in the column direction.

The control circuit CC performs an erase operation for erasing data from the selected memory transistor (selected memory transistor MTr) that is included in the selected string (selected memory string MS) connected to one end of the selected drain-side transistor (selected drain-side selection transistor SDTr). In addition to this, the control circuit CC writes data to or reads data from the memory string MS. Note that the selected string is included in the selected memory block MB.

As illustrated in FIG. 1, the control circuit CC has an address decoder circuit 110, a word-line driving circuit 120, a selection-gate-line driving circuit 130, first row decoder circuits 140, and second row decoder circuits 150.

As illustrated in FIG. 1, the address decoder circuit 110 outputs signals $V_{RA<1>}$ to $V_{RA<x>}$ for specifying a row address (a memory block MB as a target of an operation).

The signals $V_{RA<1>}$ to $V_{RA<x>}$ are input to the first row decoder circuits 140 and the second row decoder circuits 150.

As illustrated in FIG. 1, the word-line driving circuit 120 outputs signals $V_{sWL<1>}$ to $V_{sWL<4>}$ and $V_{uWL}$ to respective memory blocks MB. The signals $V_{sWL<1>}$ to $V_{sWL<4>}$ are to be supplied to a selected one of the word lines WL1 to WL4. The signal $V_{uwL}$ is to be supplied to unselected ones of the word lines WL1 to WL4.

Figure 3A:
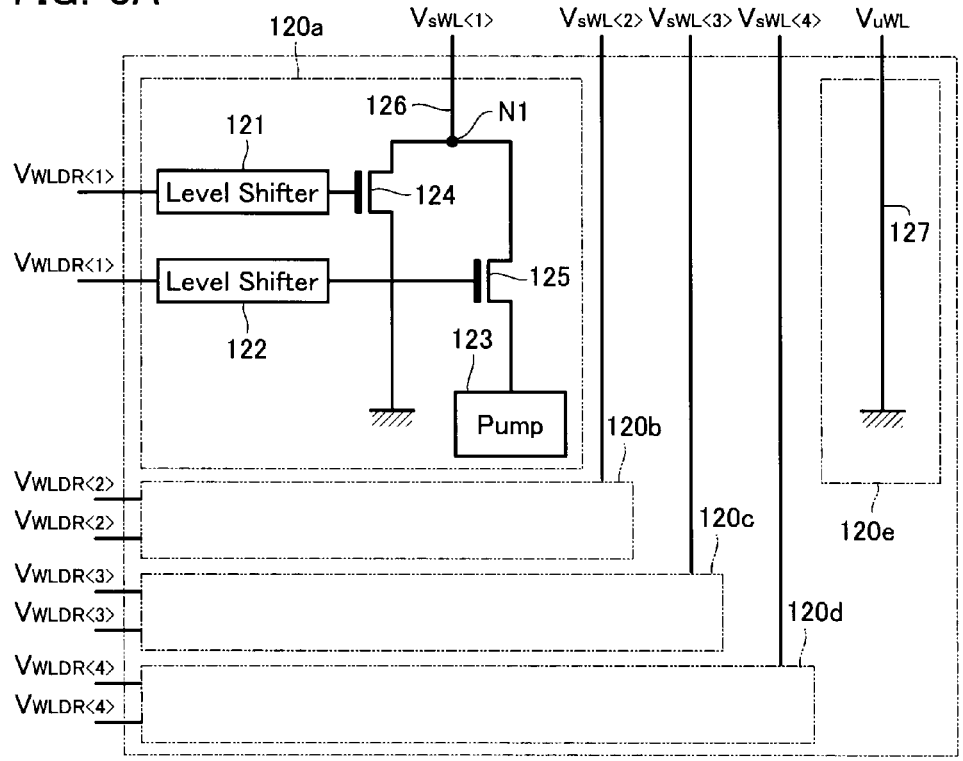
FIG. 3A is a circuit diagram of a word-line driving circuit 120 according to the first embodiment.

FIG. 3A is a circuit diagram of a word-line driving circuit 120. As illustrated in FIG. 3A, the word-line driving circuit 120 has first to fifth word-line driving circuits 120a to 120e. The first to fourth word-line driving circuits 120a to 120d receive signals $V_{WLDR<1>}$ to $V_{WLDR<4>}$, and output signals $V_{sWL<1>}$ to $V_{sWL<4>}$. The fifth word-line driving circuit 120e outputs a signal $V_{uwL}$.

As illustrated in FIG. 3A, the first word-line driving circuit 120a has level shifters 121, 122, a voltage generation circuit 123, N-MOS transistors 124, 125, and an output terminal 126. Note that the second to fourth word-line driving circuits 120b to 120d has the same configuration as the first word-line driving circuit 120a, and description thereof will be omitted.

Based on the signal $V_{WLDR<1>}$, the level shifter 121 applies a certain voltage to a gate of the N-MOS transistor 124 to provide on/off control of the N-MOS transistor 124. In addition, based on the signal $V_{WLDR<1>}$, the level shifter 122 applies a certain voltage to a gate of the N-MOS transistor 125 to provide on/off control of the N-MOS transistor 125. The voltage generation circuit 123 generates a certain voltage, which in turn is applied to one end of the N-MOS transistor 125.

The N-MOS transistor 124 has one end grounded. The N-MOS transistor 124 has a gate which receives an output signal from the level shifter 121, and the other end connected to the other end of the N-MOS transistor 125. The N-MOS transistor 125 has one end which receives an output signal from the voltage generation circuit 123. The N-MOS transistor 125 has a gate which receives an output signal from the level shifter 122, and the other end connected to the other end of the N-MOS transistor 124. The output terminal 126 is connected to a node N1 between the N-MOS transistor 124 and the N-MOS transistor 125. The output terminal 126 outputs a signal $V_{sWL<1>}$.

As illustrated in FIG. 3A, the fifth word-line driving circuit 120e has an output terminal 127. The output terminal 127 has one end grounded and the other end from which a signal $V_{uWL}$ is output.

As illustrated in FIG. 1, the selection-gate-line driving circuit 130 outputs signals $V_{sSG<1>}$, $V_{sSG<2>}$, and $V_{uSG}$ to respective memory blocks MB. The signal $V_{sSG<1>}$ is to be supplied to a selected one of the source-side selection gate lines SGS. The signal $V_{sSG<2>}$ is to be supplied to a selected one of the drain-side selection gate lines SGD. The signal $V_{uSG}$ is to be supplied to unselected ones of the source-side selection gate lines SGS and unselected ones of the drain-side selection gate lines SGD.

Figure 3B:
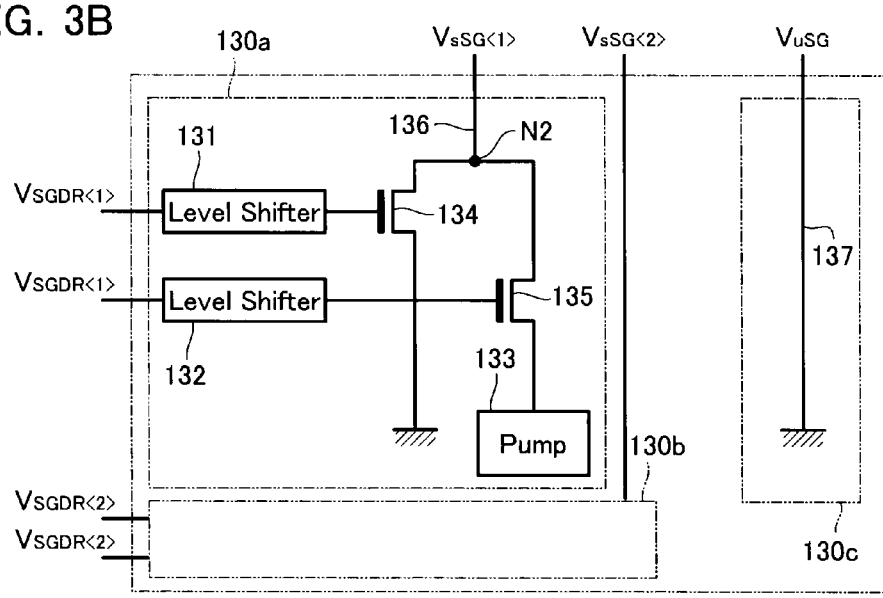
FIG. 3B is a circuit diagram of a selection-gate-line driving circuit 130 according to the first embodiment.

FIG. 3B is a circuit diagram of a selection-gate-line driving circuit 130. As illustrated in FIG. 3B, the selection-gate-line driving circuit 130 has first to third selection-gate-line driving circuits 130a to 130c. The first and second selection-gate-line driving circuits 130a and 130b receive signals $V_{SGDR<1>}$, $V_{SGDR<2>}$, and output signals $V_{sSG<1>}$, $V_{sSG<2>}$. The third selection-gate-line driving circuit 130c outputs a signal $V_{uSG}$.

As illustrated in FIG. 3B, the first selection-gate-line driving circuit 130a has level shifters 131, 132, a voltage generation circuit 133, N-MOS transistors 134, 135, and an output terminal 136. Note that the second selection-gate-line driving circuit 130b has the same configuration as the first selection-gate-line driving circuit 130a, and description thereof will be omitted.

Based on the signal $V_{SGDR<1>}$, the level shifter 131 applies a certain voltage to a gate of the N-MOS transistor 134 to provide on/off control of the N-MOS transistor 134. In addition, based on the signal $V_{SGDR<1>}$, the level shifter 132 applies a certain voltage to a gate of the N-MOS transistor 135 to provide on/off control of the N-MOS transistor 135. The voltage generation circuit 133 generates a certain voltage, which in turn is applied to one end of the N-MOS transistor 135.

The N-MOS transistor 134 has one end grounded. The N-MOS transistor 134 has a gate which receives an output signal from the level shifter 131, and the other end connected to the other end of the N-MOS transistor 135. The N-MOS transistor 135 has one end which receives an output signal from the voltage generation circuit 133. The N-MOS transistor 135 has a gate which receives an output signal from the level shifter 132, and the other end connected to the other end of the N-MOS transistor 134. The output terminal 136 is connected to a node N2 between the N-MOS transistor 134 and the N-MOS transistor 135. The output terminal 136 outputs a signal $V_{ssG<1>}$.

As illustrated in FIG. 3B, the third selection-gate-line driving circuit 130c has an output terminal 137. The output terminal 137 has one end grounded and the other end from which a signal $V_{usG}$ is output.

As illustrated in FIG. 1, the first row decoder circuits 140 are provided, one for each memory block MB (for those memory strings MS aligned in the row direction). The first row decoder circuits 140 receive signals $V_{RA<1>}$ to $V_{RA<X>}$, $V_{sWL<1>}$ to $V_{sWL<4>}$, and $V_{uwL}$ to control the voltages of the word lines WL1 to WL4.

As illustrated in FIG. 1, each first row decoder circuit 140 has a NAND circuit 141a, a level shifter 141b, an inverter 141c, first transfer transistors 142 to 145, and second transfer transistors 146 to 149.

The NAND circuit 141a receives signals $V_{RA<1>}$ to $V_{RA<x>}$ and supplies an output signal based on these signals to the level shifter 141b. Based on the signal from the NAND circuit 141a, the level shifter 141b generates a signal at a certain voltage, which in turn is input to a input terminal of the inverter 141c and to a gates of the first transfer transistors 142 to 145. The inverter 141c receives the output signal from the level shifter 141b, and inputs an output signal based on that signal to gates of the second transfer transistors 146 to 149.

The first transfer transistors 142 to 145 have one ends which receive signals $V_{swL<1>}$ to $V_{swL<4>}$. The first transfer transistors 142 to 145 have gates which receive the output signal from the level shifter 141b, and the other ends connected to the word lines WL1 to WL4, respectively. The second transfer transistors 146 to 149 have one ends which receive a signal $V_{uwL}$. The second transfer transistors 146 to 149 have gates which receive the output signal from the inverter 141c, and the other ends connected to the word lines WL1 to WL4, respectively.

As illustrated in FIG. 1, the second row decoder circuits 150 are provided, one for each memory block MB (for those memory strings MS aligned in the row direction). The second row decoder circuits 150 receive signals $V_{RA<1>}$ to $V_{RA<X>}$, $V_{ssG<1>}$, $V_{ssG<2>}$, and $V_{usG}$ to control the voltages of the source-side selection gate lines SGS and the drain-side selection gate lines SGD.

As illustrated in FIG. 1, each second row decoder circuit 150 has a NAND circuit 151a, a level shifter 151b, an inverter 151c, first transfer transistors 152, 153, and second transfer transistors 154, 155.

The NAND circuit 151a receives signals $V_{RA<1>}$ to $V_{RA<X>}$ and supplies an output signal based on these signals to the level shifter 151b. Based on the signal from the NAND circuit 151a, the level shifter 151b generates a signal at a certain voltage, which in turn is input to a input terminal of the inverter 151c and gates of the first transfer transistors 152, 153. The inverter 151c receives the output signal from the level shifter 151b, and inputs an output signal based on that signal to gates of the second transfer transistors 154, 155.

The first transfer transistor 152 has one end which receives a signal $V_{ssG<1>}$. The first transfer transistor 152 has a gate which receives an output signal from the level shifter 151b, and the other end connected to the source-side selection gate line SGS. The first transfer transistor 153 has one end which receives a signal $V_{ssG<2>}$. The first transfer transistor 153 has a gate which receives an output signal from the level shifter 151b, and the other end connected to the drain-side selection gate line SGD.

The second transfer transistors 154, 155 have one ends which receive a signal $V_{uWL}$. The second transfer transistors 154, 155 have gates which receive an output signal from the inverter 151c. The second transfer transistor 154 has the other end connected to the source-side selection gate line SGS. The second transfer transistor 155 has the other end connected to the drain-side selection gate line SGD.

[Lamination Structure of Non-Volatile Semiconductor Storage Device in First Embodiment]

Figure 4:
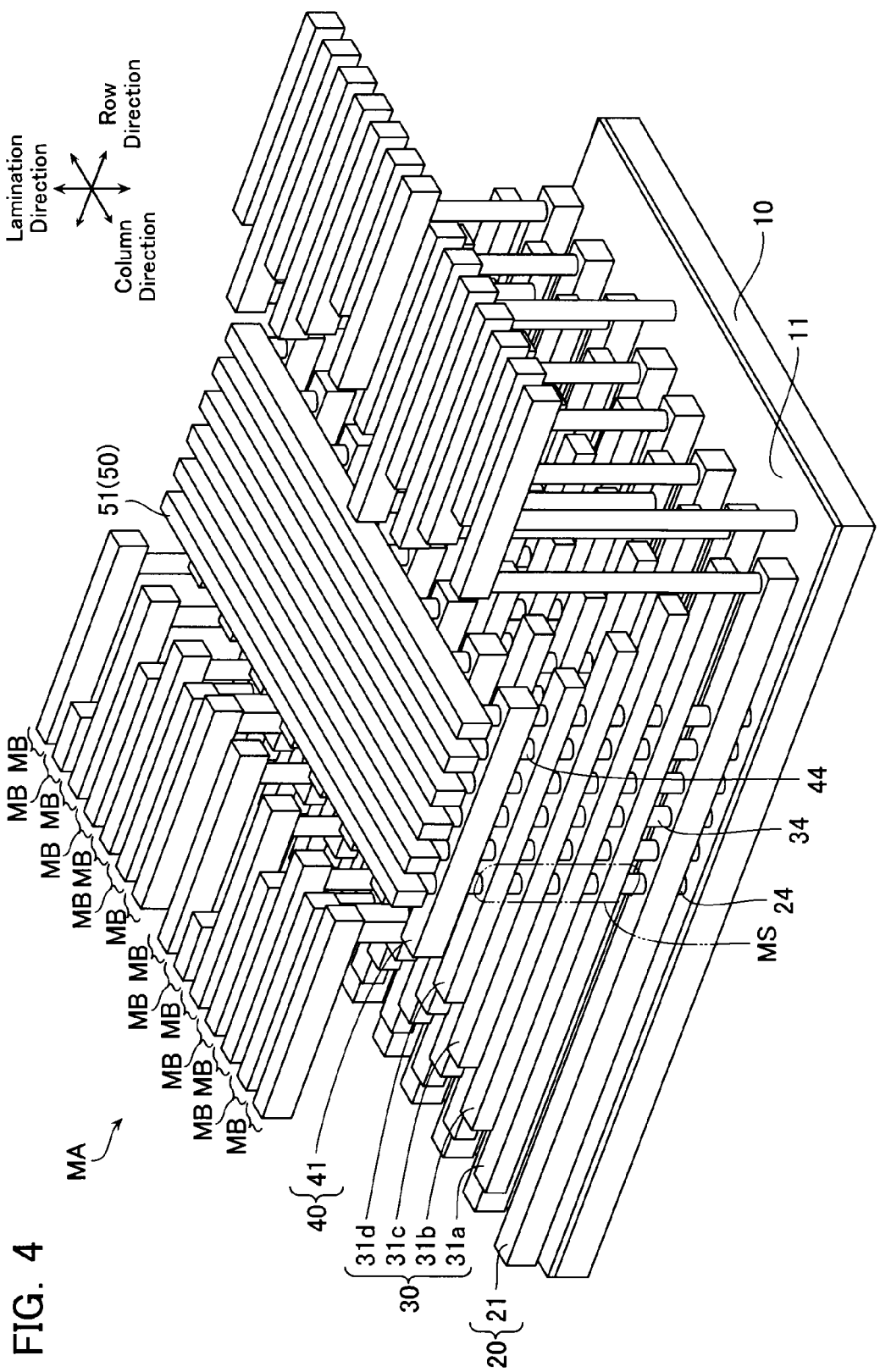
FIG. 4 is a schematic perspective view illustrating a part of one memory cell array MA in the non-volatile semiconductor storage device according to the first embodiment.
Figure 5:
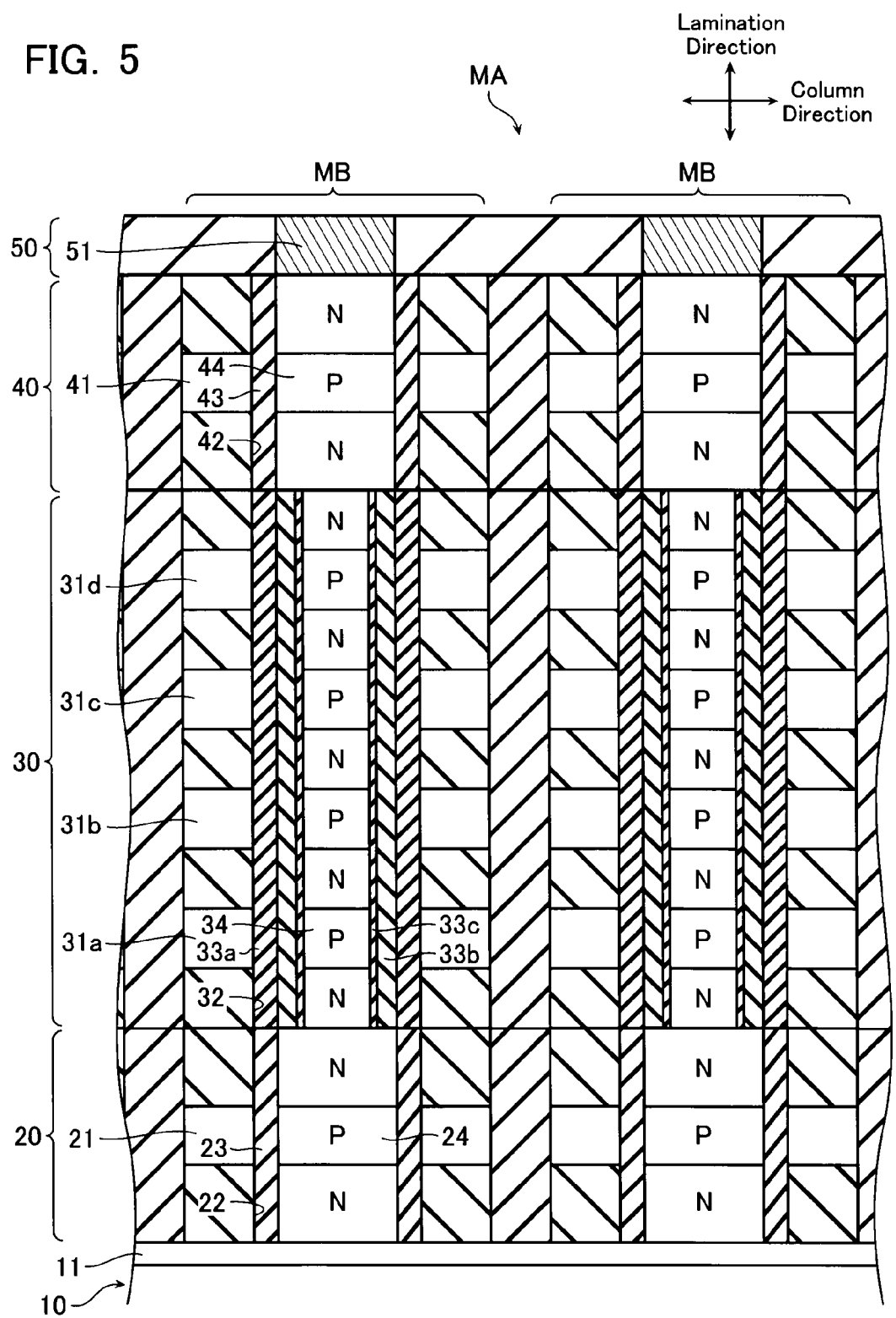
FIG. 5 is a partial cross-sectional view of FIG. 4.

Referring now to FIGS. 4 and 5, a lamination structure of the non-volatile semiconductor storage device according to the first embodiment will be described below. FIG. 4 is a schematic perspective view illustrating a part of one memory cell array MA in the non-volatile semiconductor storage device of the first embodiment. FIG. 5 is a partial cross-sectional view of FIG. 4.

As illustrated in FIG. 4, the memory cell array MA (memory blocks MB) is provided on a substrate 10. The memory cell array MA has a source-side selection transistor layer 20, a memory transistor layer 30, a drain-side selection transistor layer 40, and a wiring layer 50. The substrate 10 functions as the source line SL. The source-side selection transistor layer 20 functions as the source-side selection transistors SSTr. The memory transistor layer 30 functions as the memory transistors MTr1 to MTr4 (memory strings MS). The drain-side selection transistor layer 40 functions as the drain-side selection transistors SDTr. The wiring layer 50 functions as the bit lines BL.

As illustrated in FIGS. 4 and 5, the substrate 10 has a diffusion layer 11 on its surface. The diffusion layer 11 functions as the source line SL.

As illustrated in FIGS. 4 and 5, the source-side selection transistor layer 20 has source-side conductive layers 21 on the substrate 10. The source-side conductive layers 21 function as the source-side selection gate lines SGS as well as the gates of source-side selection transistors SSTr.

Each source-side conductive layer 21 is formed to be sandwiched between interlayer insulation layers on the top and bottom. The source-side conductive layers 21 are formed in a stripe pattern so as to extend in the row direction at a certain pitch in the column direction. The source-side conductive layers 21 comprise polysilicon (p-Si).

As illustrated in FIGS. 4 and 5, the source-side selection transistor layer 20 has source-side holes 22.

The source-side holes 22 are formed to penetrate the source-side conductive layers 21. The source-side holes 22 are formed at positions matching the diffusion layer 11. The source-side holes 22 are formed in a matrix form in the row and column directions.

As illustrated in FIG. 5, the source-side selection transistor layer 20 has source-side gate insulation layers 23 and source-side columnar semiconductor layers 24. Each source-side columnar semiconductor layer 24 functions as a body of a respective source-side selection transistor SSTr.

The source-side gate insulation layers 23 are formed with a certain thickness on sidewalls of the source-side holes 22. The source-side gate insulation layers 23 comprise silicon oxide (SiO$_2$). The source-side gate insulation layers 23 are configured to have a high breakdown voltage since a high voltage is applied between the sources and drains of the source-side selection transistors SSTr, as described below.

The source-side columnar semiconductor layers 24 are formed in contact with the source-side gate insulation layers 23 so as to fill up the source-side holes 22. The source-side columnar semiconductor layers 24 are formed in contact with top surfaces of the diffusion layers 11 and in a columnar shape extending in the lamination direction. The source-side columnar semiconductor layers 24 comprise polysilicon (p-Si). One portion of each source-side columnar semiconductor layer 24 is of p-type that is located in the same layer as the corresponding source-side conductive layer 21, whereas the other portions are of n-type. That is, as described below, each source-side columnar semiconductor layer 24 comprises: an n-type layer in contact with the bottom surface of the corresponding memory columnar semiconductor layer 34; a p-type layer located below the n-type layer; and another n-type layer located below the p-type layer.

The above-mentioned configuration of the source-side selection transistor layer 20 is restated as follows: the source-side gate insulation layers 23 are formed to surround the source-side columnar semiconductor layers 24; and the source-side conductive layers 21 are formed to surround the source-side columnar semiconductor layers 24 via the source-side gate insulation layers 23.

In the source-side selection transistor layer 20, the p-type portions of source-side columnar semiconductor layers 24 are inverted by applying a certain voltage to the corresponding source-side conductive layers 21, thereby forming n-type channels. This makes the source-side selection transistors SSTr conductive.

As illustrated in FIGS. 4 and 5, the memory transistor layer 30 has word-line conductive layers 31a to 31d on the source-side selection transistor layer 20. The word-line conductive layers 31a to 31d function as the word lines WL1 to WL4 as well as the gates of the memory transistors MTr1 to MTr4.

The word-line conductive layers 31a to 31d are laminated via interlayer insulation layers. The word-line conductive layers 31a to 31d are formed in a stripe pattern so as to extend in the row direction at a certain pitch in the column direction. The word-line conductive layers 31a to 31d comprise polysilicon (p-Si).

As illustrated in FIGS. 4 and 5, the memory transistor layer 30 has memory holes 32.

The memory holes 32 are formed to penetrate the word-line conductive layers 31a to 31d. The memory holes are formed in a matrix form in the row and column directions. The memory holes 32 are formed at positions matching the source-side holes 22.

As illustrated in FIG. 5, the memory transistor layer has block insulation layers 33a, electric charge storage layers 33b, tunnel insulation layers 33c, and memory columnar semiconductor layers 34. The electric charge storage layers 33b have a function for accumulating electric charges. Each memory columnar semiconductor layer 34 functions as a body of each of memory transistors MTr1 to MTr4.

The block insulation layers 33a are formed with a certain thickness on sidewalls of the memory holes 32. The block insulation layers 33a comprise silicon oxide (SiO$_2$). The electric charge storage layers 33b are formed with a certain thickness and in contact with the block insulation layers 33a. The electric charge storage layers 33b comprise silicon nitride (SiN). The tunnel insulation layers 33c are formed in contact with the electric charge storage layers 33b. The tunnel insulation layers 33c comprise silicon oxide (SiO$_2$).

The memory columnar semiconductor layers 34 are formed in contact with the tunnel insulation layers 33c so as to fill up the memory holes 32. The memory columnar semiconductor layers 34 are formed in contact with top surfaces of the source-side columnar semiconductor layers 24 and in a columnar shape extending in the lamination direction. The memory columnar semiconductor layers 34 comprise polysilicon (p-Si). Those portions of each memory columnar semiconductor layer 34 are of p-type that are located in the same layers as the word-line conductive layers 31a to 31d, respectively, whereas the other portions are of n-type.

The above-mentioned configuration of the memory transistor layer 30 is restated as follows: the tunnel insulation layers 33c, the electric charge storage layers 33b, and the block insulation layers 33a are together formed to surround the memory columnar semiconductor layers 34. In addition, the word-line conductive layers 31a to 31d are formed to surround the memory columnar semiconductor layers 34 via the tunnel insulation layers 33c, the electric charge storage layers 33b, and the block insulation layers 33a.

In the memory transistor layer 30, the p-type portions of memory columnar semiconductor layers 34 are inverted by applying a certain voltage to the corresponding word-line conductive layers 31a to 31d, thereby forming n-type channels. This makes the memory transistors MTr1 to MTr4 conductive.

As illustrated in FIGS. 4 and 5, the drain-side selection transistor layer 40 has drain-side conductive layers 41 on the memory transistor layer 30. The drain-side conductive layers 41 function as the drain-side selection gate lines SGD as well as the gates of drain-side selection transistors SDTr.

The drain-side conductive layers 41 are formed to be sandwiched between interlayer insulation layers on the top and bottom. The drain-side conductive layers 41 are formed in a stripe pattern so as to extend in the row direction at a certain pitch in the column direction. The drain-side conductive layers 41 comprise polysilicon (p-Si).

As illustrated in FIGS. 4 and 5, the drain-side selection transistor layer 40 has drain-side holes 42.

The drain-side holes 42 are formed to penetrate the drain-side conductive layers 41. The drain-side holes 42 are formed at positions matching the memory holes 32. The drain-side holes 42 are formed in a matrix form in the row and column directions.

As illustrated in FIG. 5, the drain-side selection transistor layer 40 has drain-side gate insulation layers and drain-side columnar semiconductor layers 44. Each drain-side columnar semiconductor layer 44 functions as a body of a respective drain-side selection transistor SDTr.

The drain-side gate insulation layers 43 are formed with a certain thickness on sidewalls of the drain-side holes 42. The drain-side gate insulation layers 43 comprise silicon oxide (SiO$_2$). The drain-side gate insulation layers 43 are configured to have a high breakdown voltage since a high voltage is applied between the sources and drains of the drain-side selection transistors SDTr, as described below.

The drain-side columnar semiconductor layers 44 are formed in contact with the drain-side gate insulation layers 43 so as to fill up the drain-side holes 42. The drain-side columnar semiconductor layers 44 are formed in contact with top surfaces of the memory columnar semiconductor layers 34 and in a columnar shape extending in the lamination direction. The drain-side columnar semiconductor layers 44 comprise polysilicon (p-Si). Those portions of the drain-side columnar semiconductor layers 44 are of p-type that are located in the same layer as the drain-side conductive layers 41, whereas the other portions are of n-type. That is, each drain-side columnar semiconductor layer 44 comprises: an n-type layer in contact with the top surface of the corresponding memory columnar semiconductor layer 34; a p-type layer located above the n-type layer; and another n-type layer located above the p-type layer.

In the drain-side transistor layer 40, the p-type portions of drain-side columnar semiconductor layers 44 are inverted by applying a certain voltage to the corresponding drain-side conductive layers 41, thereby forming n-type channels. This makes the drain-side selection transistors SDTr conductive.

The above-mentioned configuration of the drain-side selection transistor layer 40 is restated as follows: the drain-side gate insulation layers 43 are formed to surround the drain-side columnar semiconductor layers 44; and the drain-side conductive layers 41 are formed to surround the drain-side columnar semiconductor layers via the drain-side gate insulation layers 43.

As illustrated in FIGS. 4 and 5, the wiring layer has bit line layers 51 on the drain-side selection transistor layer 40. The bit line layers 51 function as the bit lines BL. The bit line layers 51 are formed in a stripe pattern so as to extend in the column direction at a certain pitch in the row direction. The bit line layers 51 are formed in contact with top surfaces of the drain-side columnar semiconductor layers 44. The bit line layers 51 comprise tungsten (W).

[Erase Operation of Non-Volatile Semiconductor Storage Device in First Embodiment]

Figure 6:
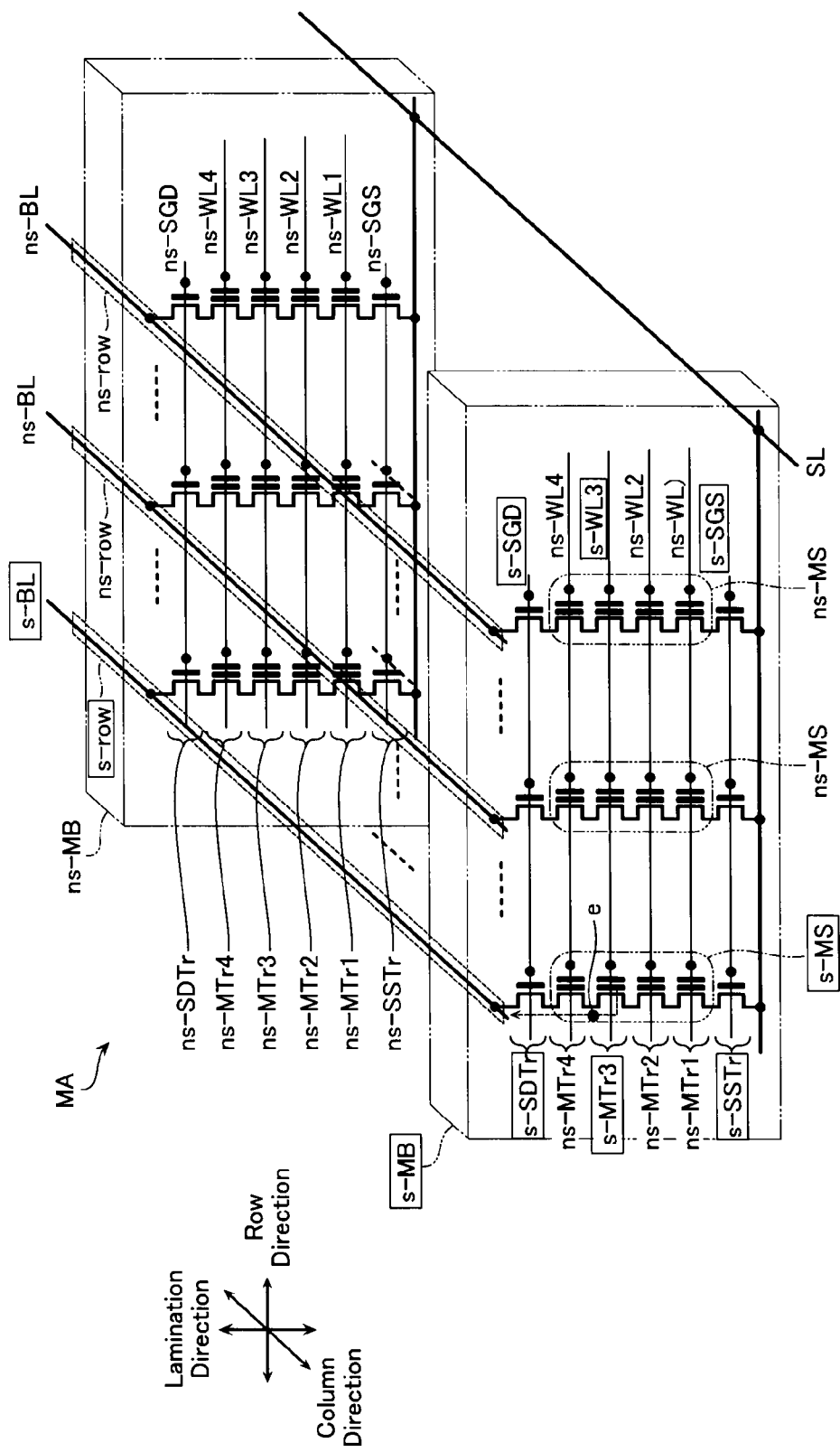
FIG. 6 is a schematic diagram illustrating an erase operation of the non-volatile semiconductor storage device according to the first embodiment.
Figure 8:
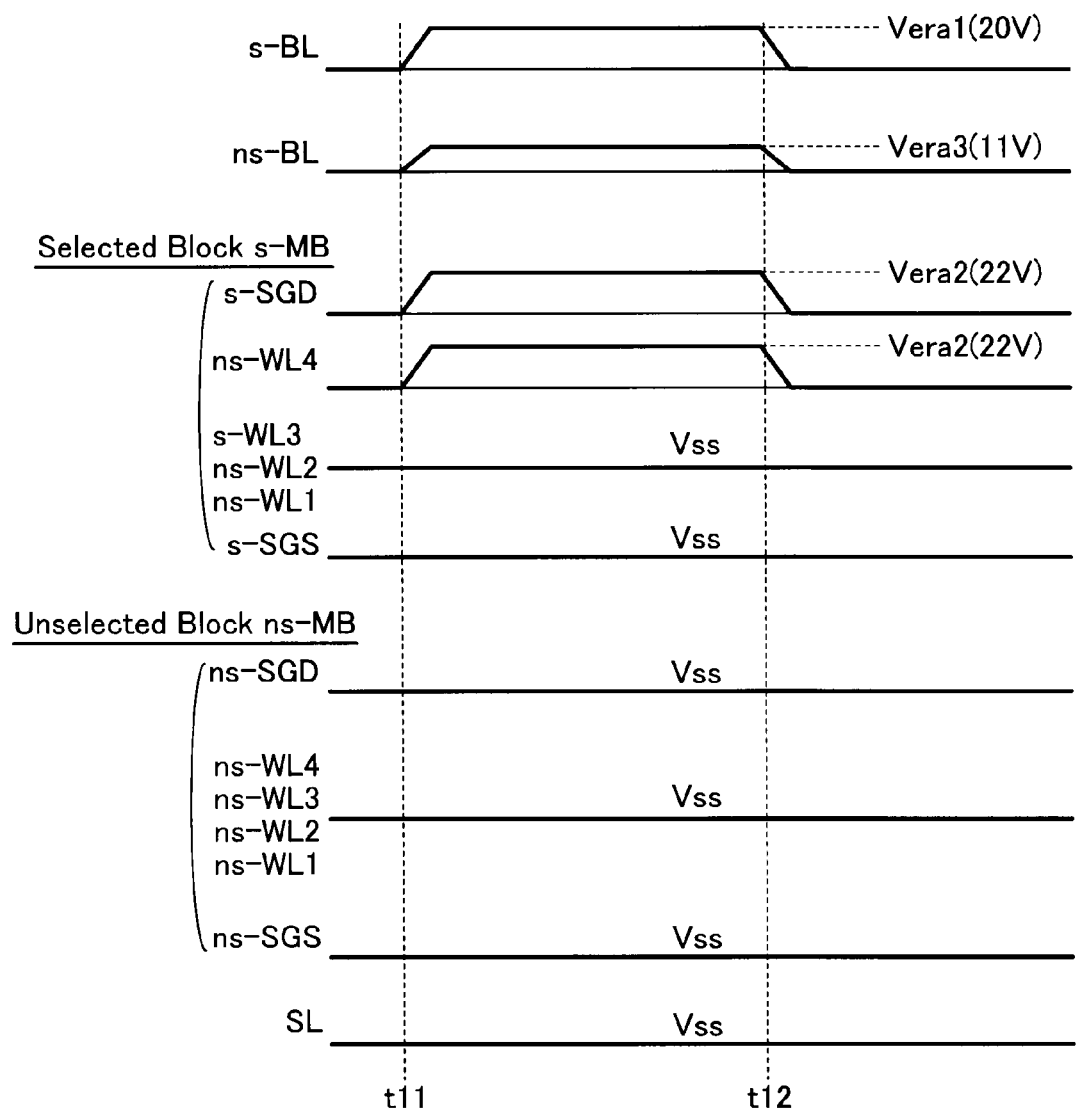
FIG. 8 is a timing chart illustrating the erase operation of the non-volatile semiconductor storage device according to the first embodiment.

Referring now to FIGS. 6 to 8, an erase operation of the non-volatile semiconductor storage device according to the first embodiment will be described below. FIG. 6 schematically illustrates an erase operation of the non-volatile semiconductor storage device of the first embodiment. FIG. 7 illustrates voltages applied during the erase operation. FIG. 8 is a timing chart illustrating the erase operation.

As illustrated in FIG. 6, in the first embodiment, it is assumed that the erase operation is performed on a memory transistor MTr3 (hereinafter, a "selected memory transistor s-MTr3") in a selected memory string MS (hereinafter referred to as a "selected string s-MS"). The selected string s-MS is located in a selected row (hereinafter, a "selected row s-row") in a selected memory block MB (hereinafter, a "selected block s-MB"). Additionally, according to the first embodiment, the erase operation is performed by extracting electrons e from the electric charge storage layer of the selected memory transistor s-MTr3, as illustrated in FIG. 6.

In addition, the source-side selection transistor SSTr in the selected string s-MS is hereinafter referred to as the "selected source-side transistor s-SSTr". The drain-side selection transistor SDTr in the selected string s-MS is referred to as the "selected drain-side transistor s-SDTr".

In addition, the selected bit line BL located in the selected row s-row is referred to as the "selected bit line s-BL". The selected source-side selection gate line SGS within the selected block s-MB is referred to as the "selected source-side gate line s-SGS". The selected drain-side selection gate line SGD within the selected block s-MB is referred to as the "selected drain-side gate line s-SGD". The selected word line WL3 within the selected block s-MB is referred to as the "selected word line s-WL3".

In addition, unselected bit lines BL are referred to as "unselected bit lines ns-BL". Similarly, unselected word lines WL1 to WL4 are referred to as "unselected word lines ns-WL1 to ns-WL4". In addition, unselected source-side selection gate lines SGS and unselected drain-side selection gate lines SGD are referred to as "unselected source-side gate lines ns-SGS" and "unselected drain-side gate lines ns-SGD", respectively.

Moreover, unselected memory transistors MTr1, MTr2, . . . , MTr4 are referred to as "unselected memory transistors ns-MTr1, ns-MTr2, . . . , ns-MTr4". Similarly, unselected source-side selection transistors SSTr and unselected drain-side selection transistors SDTr are referred to as "unselected source-side transistors ns-SSTr" and "unselected drain-side transistors ns-SDTr", respectively.

The voltages applied to different components during the erase operation in the first embodiment can be represented as shown in FIG. 7. FIG. 7 illustrates the voltages of the respective components in the selected row s-row and the unselected rows ns-row within the selected block s-MB, and those in the selected row s-row and the unselected rows ns-row within the unselected blocks ns-MB.

The erase operation will now be described below with reference to the timing chart of FIG. 8. At time t11 of FIG. 8, the control circuit CC boosts the selected bit line s-BL to a voltage Vera1 (e.g., 20V).

In addition, at time t11 of FIG. 8, the control circuit CC boosts the selected drain-side gate line s-SGD within the selected block s-MB to a voltage Vera2 (e.g., 22V). In this way, the control circuit CC causes the selected drain-side transistor s-SDTr to turn on. Note that the voltage Vera2 (22V) is the voltage Vera1 (20V) plus a threshold voltage Vth (2V).

In addition, at time t11 of FIG. 8, the control circuit CC boosts the unselected word line ns-WL4 in the selected block s-MB to the voltage Vera2, while maintaining the unselected word lines ns-WL1, ns-WL2, and the selected word line s-WL3 in the selected block s-MB at the ground voltage (0V). That is, the control circuit CC causes the memory transistor MTr4 (the unselected memory transistor ns-MTr4) to turn on that is closer to the drain-side selection transistor SDTr than the selected memory transistor s-MTr3, by applying a certain voltage to the word line WL4 (the unselected word line ns-WL4) that is closer to the drain-side selection gate line SGD than the selected word line s-WL3. Consequently, the voltage Vera1 of the selected bit line s-BL is applied to the gate of the selected memory transistor s-MTr3. In this case, such a potential difference is introduced between the voltage Vera1 (20V) and the ground voltage (0V) that extracts the electrons e accumulated in the electric charge storage layers of the memory transistors MTr1 to MTr4. As a result, data is erased from the selected memory transistor s-MTr3. In other words, such a potential difference between the voltage Vera1 (20V) and the ground voltage (0V) causes a change in electric charges on the electric charge accumulation layers of the memory transistors MTr1 to MTr4.

In addition, at time t11 of FIG. 8, the control circuit CC boosts the unselected bit lines ns-BL to a voltage Vera3 (e.g., 11V). There is provided such a potential difference between the voltage Vera3 and the voltage Vera2 that inhibits incorrect write or erase operations on the memory transistors MTr1 to MTr4 (the voltage Vera3 is on the order of half the voltage Vera2). Thus, the non-volatile semiconductor storage device of the first embodiment inhibits incorrect write or erase operations on the unselected memory transistors ns-MTr1 to ns-MTr4 in the unselected blocks ns-MB.

Then, at time t12 of FIG. 8, the control circuit CC reduces the voltages of all wirings to the ground voltage Vss. At this point, the non-volatile semiconductor storage device according to the first embodiment completes the erase operation.

Note that upon completion of the above-mentioned erase operation, the control circuit CC transitions to a preliminary operation for performing an erase operation on the next memory transistors MTr1 to MTr4 to be erased. In this preliminary operation, the control circuit CC initializes the following nodes to the ground voltage Vss: the memory transistors MTr1 to MTr4, the drain-side selection gate lines SGD, and the source-side selection gate lines SGS. For example, after fixing the source line SL at the ground voltage Vss, the control circuit CC causes the source-side selection gate lines SGS, the word lines WL1 to WL4, and the drain-side selection gate lines SGD to go high, and fixes the nodes between the respective transistors at the ground voltage Vss. Thereafter, the control circuit CC causes the wirings to be cut off, in order of the farthest from the source line SL first.

(Advantages of Non-Volatile Semiconductor Storage Device in First Embodiment)

Advantages of the non-volatile semiconductor storage device according to the first embodiment will now be described below. According to the first embodiment, data may be erased only from a specific memory transistor MTr included in a memory block MB, instead of an entire memory block MB. Therefore, unlike the conventional art, the non-volatile semiconductor storage device according to the first embodiment does not require any write-back operations after erasing all data from a memory block, which allows for faster data erase operations.

Second Embodiment

[Circuit Configuration of Non-Volatile Semiconductor Storage Device in Second Embodiment]

Figure 9:
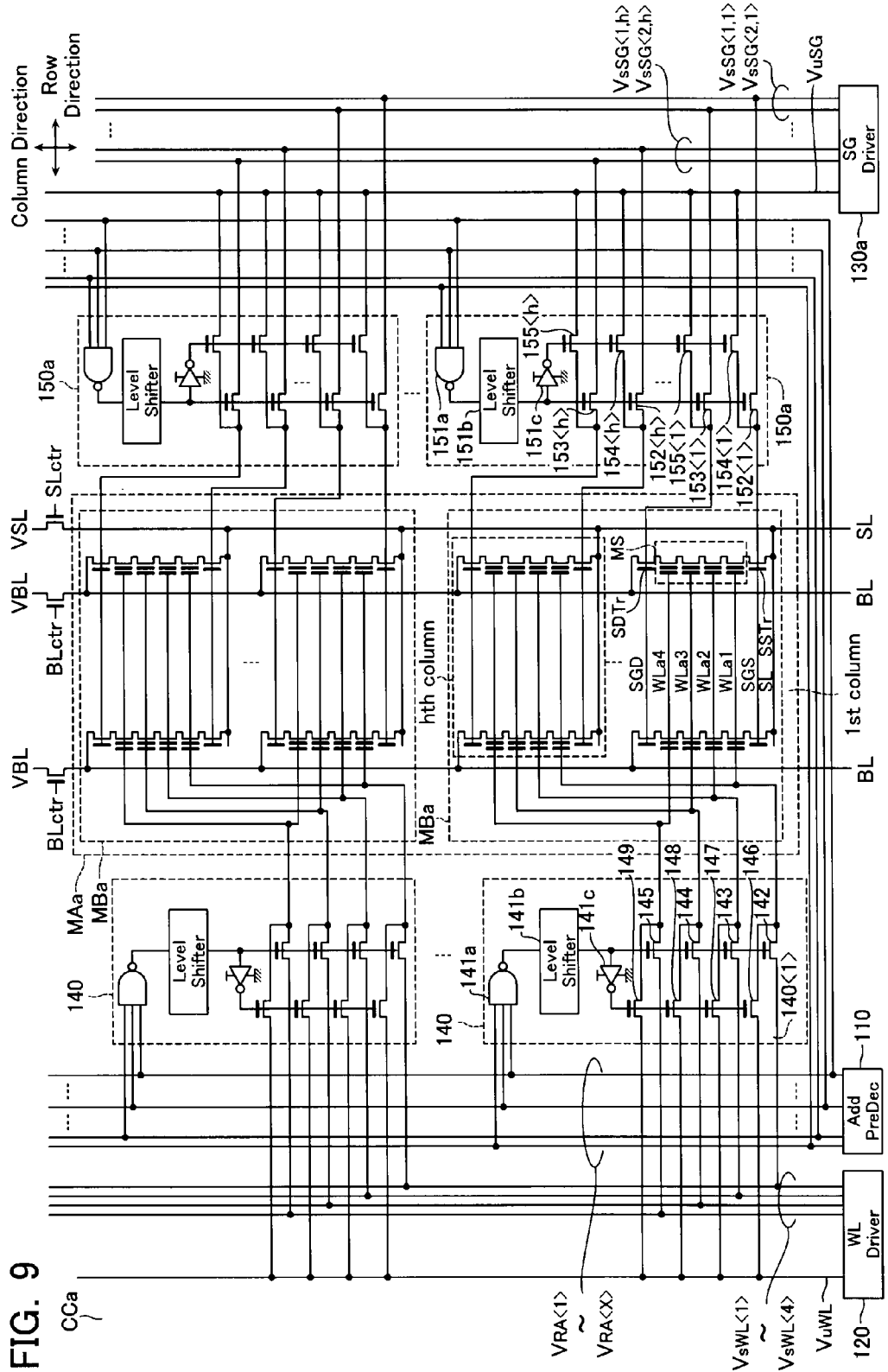
FIG. 9 is a circuit diagram of a non-volatile semiconductor storage device according to a second embodiment.
Figure 10:
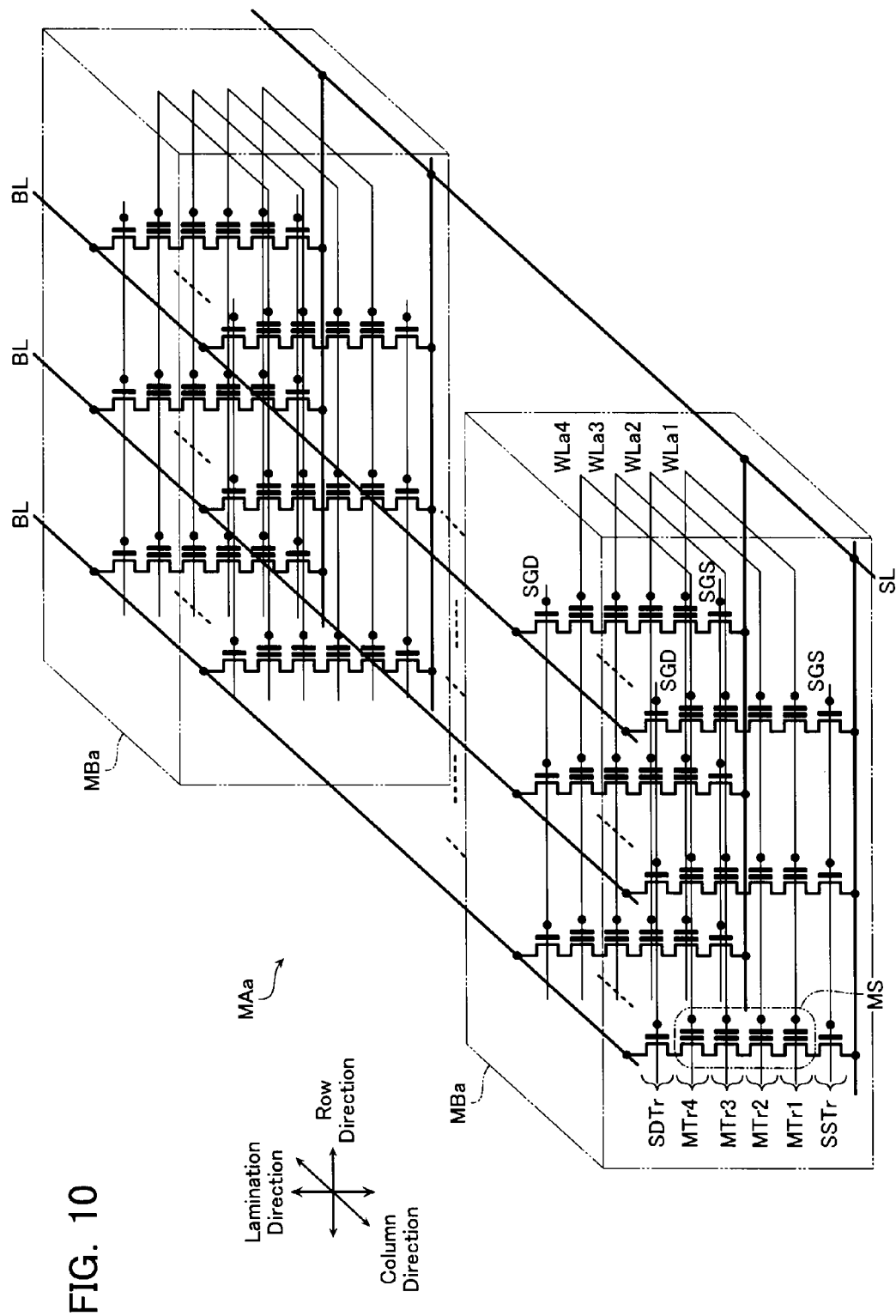
FIG. 10 is a circuit diagram of one memory cell array MAa according to the second embodiment.

Referring now to FIGS. 9 and 10, a circuit configuration of a non-volatile semiconductor storage device according to a second embodiment will be described below. FIG. 9 is a circuit diagram of the non-volatile semiconductor storage device according to the second embodiment. FIG. 10 is a circuit diagram of one memory cell array MAa according to the second embodiment. Note that the same reference numerals represent the same components as the first embodiment, and description thereof will be omitted in the second embodiment.

As illustrated in FIG. 9, the non-volatile semiconductor storage device of the second embodiment comprises a memory cell array MAa and a control circuit CCa that are different from the first embodiment.

As illustrated in FIGS. 9 and 10, each memory cell array MAa has memory blocks MBa different from the first embodiment. Each memory block MBa has memory strings MS, source-side selection transistors SSTr, and drain-side selection transistors SDTr that are arranged in a matrix form in the row and column directions. In this regard, the first embodiment is different from the second embodiment in that each memory block MB of the first embodiment has memory strings MS aligned only in the row direction. As illustrated in FIG. 9, in the second embodiment, each memory block MBa includes h columns of memory strings MS arranged in the column direction.

Each memory block MBa has word lines WLa1 to WLa4 different from the first embodiment. As illustrated in FIGS. 9 and 10, the word lines WLa1 to WLa4 are commonly connected to the gates of the memory transistors MTr1 to MTr4 arranged in a matrix form in the row and column directions, respectively. The word lines WLa1 to WLa4 are formed to expand in a two-dimensional manner in the row and column directions.

As illustrated in FIG. 9, the control circuit CCa has a selection-gate-line driving circuit 130a and second row decoder circuits 150a that are different from the first embodiment.

As illustrated in FIG. 9, the selection-gate-line driving circuit 130a outputs signals $V_{sSG<1,k>}$ (k=1 to h), $V_{sSG<2,k>}$, and $V_{uSG}$. The signals $V_{sSG<1,k>}$ are to be supplied to one of the source-side selection transistors SSTr that is located in the k-th column in the column direction of one memory block MBa, and that is the selected one. The signals $V_{sSG<2,k>}$ are to be supplied to one of the drain-side selection transistors SDTr that is located in the k-th column in the column direction of one memory block MBa, and that is the selected one.

As illustrated in FIG. 9, each second row decoder circuit 150a has first transfer transistors 152<k> (k=1 to h) and 153<k>, as well as second transfer transistors 154<k> and 155<k>.

As illustrated in FIG. 9, the first transfer transistors 152<k> have one ends which receive signals $V_{SSG<1,k>}$. The first transfer transistors 152<k> have gates which receive output signals from the level shifter 151b, and the other ends connected to the source-side selection gate lines SGS in the k-th column in the column direction of one memory block MBa. The first transfer transistors 153<k> have one ends which receive signals $V_{SSG<2,k>}$. The first transfer transistors 152<k> have gates which receive output signals from the level shifter 151b, and the other ends connected to the drain-side selection gate line SGD in the k-th column in the column direction of one memory block MBa.

As illustrated in FIG. 9, the second transfer transistors 154<k> have one ends which receive a signal $V_{uSG}$. The second transfer transistors 154<k> have gates which receive output signals from the inverter 151c, and the other ends connected to the source-side selection gate line SGS in the k-th column in the column direction of one memory block MBa. The second transfer transistors 155<k> have one ends which receive a signal $V_{uSG}$. The second transfer transistors 155<k> have gates which receive output signals from the inverter 151c, and the other ends connected to the drain-side selection gate line SGD in the k-th column in the column direction of one memory block MBa.

[Lamination Structure of Non-Volatile Semiconductor Storage Device in Second Embodiment]

Figure 11:
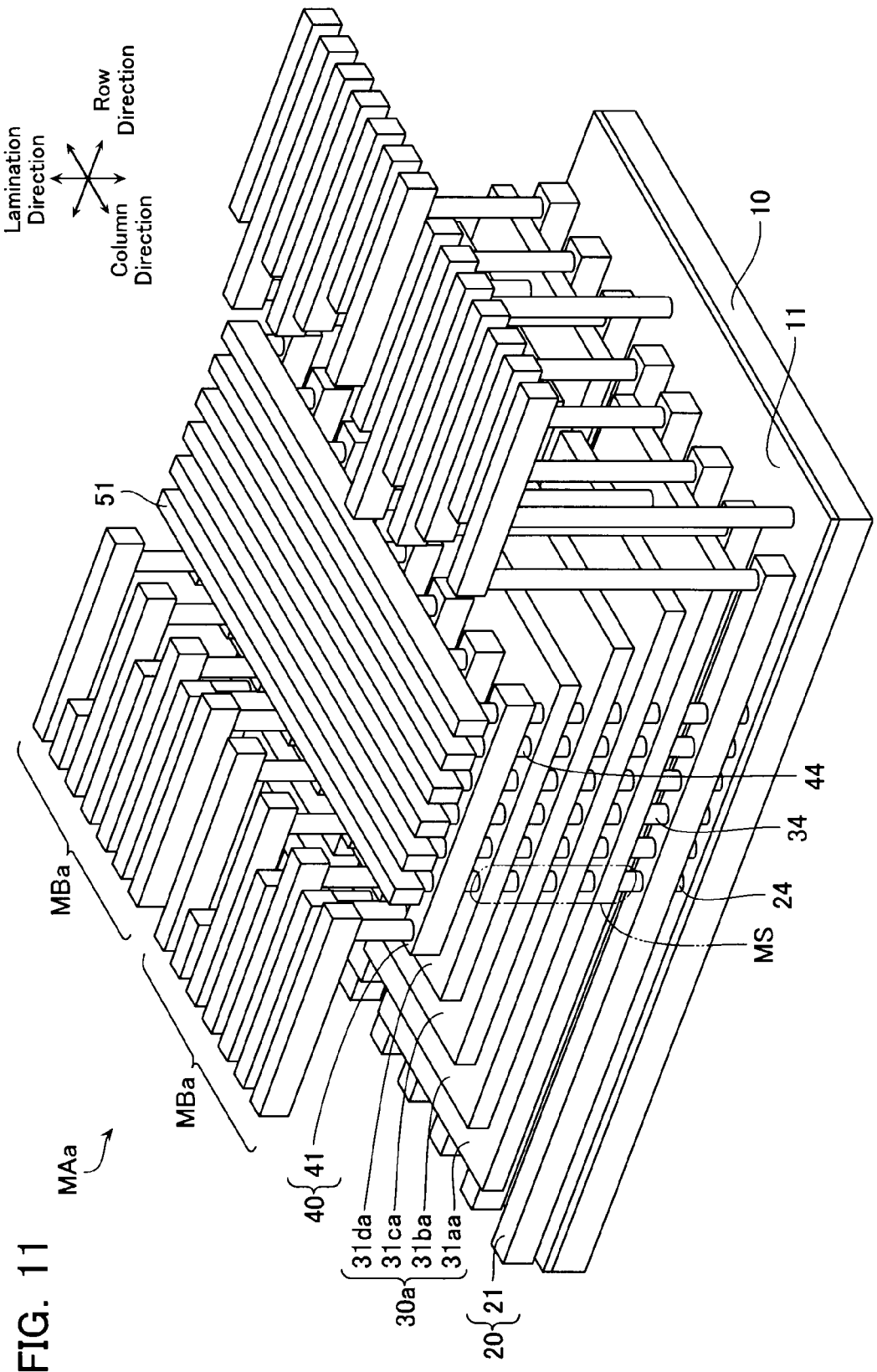
FIG. 11 is a schematic perspective view of the non-volatile semiconductor storage device according to the second embodiment.
Figure 12:
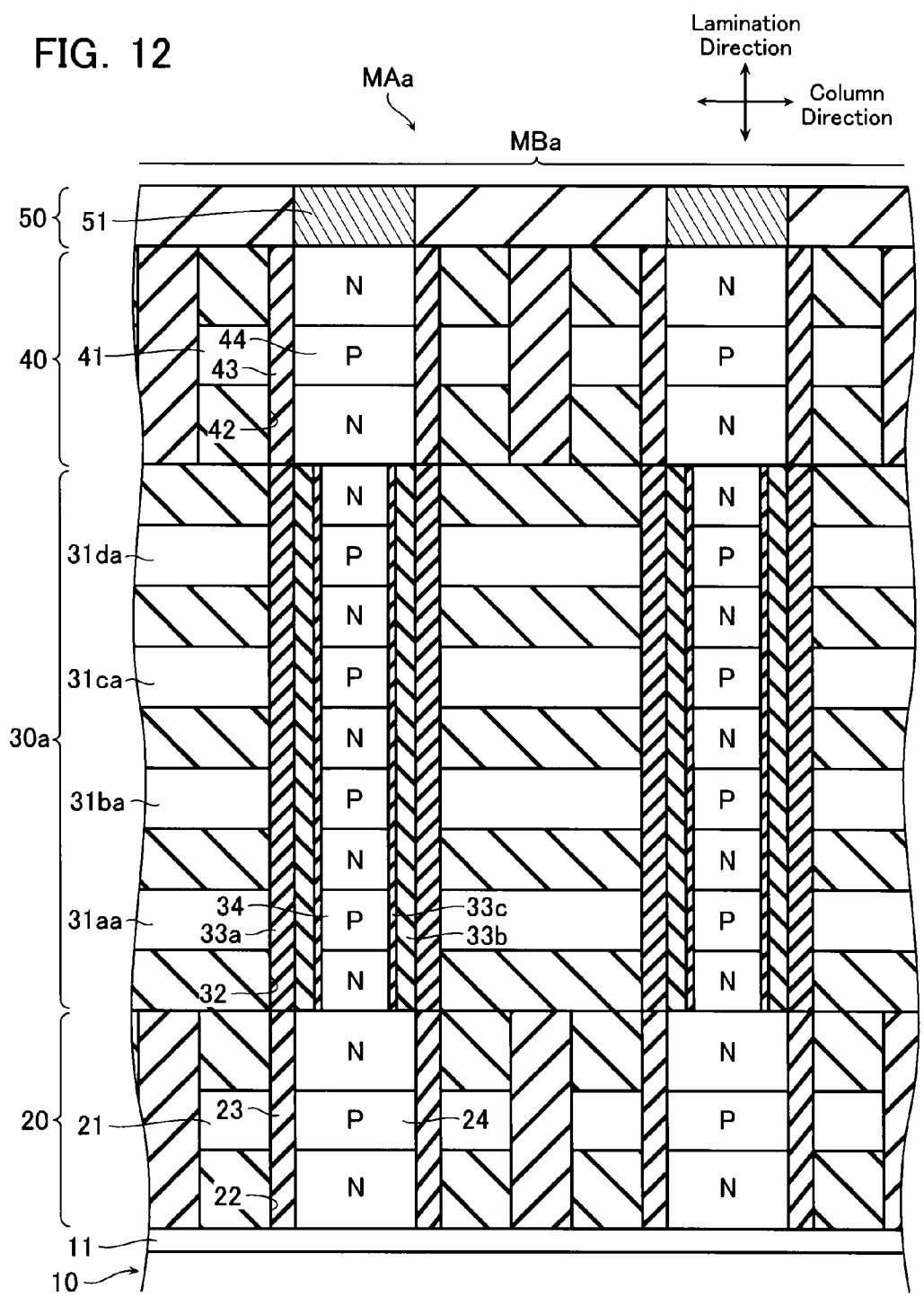
FIG. 12 is a partial cross-sectional view of FIG. 11.

Referring now to FIGS. 11 and 12, a lamination structure of the non-volatile semiconductor storage device according to the second embodiment will be described below. FIG. 11 is a schematic perspective view of the non-volatile semiconductor storage device of the second embodiment. FIG. 12 is a partial cross-sectional view of FIG. 11.

As illustrated in FIGS. 11 and 12, the non-volatile semiconductor storage device of the second embodiment comprises a memory transistor layer 30a different from the first embodiment.

The memory transistor layer 30a has word-line conductive layers 31aa to 31da different from the first embodiment. The word-line conductive layers 31aa to 31da are each formed in a plate-like form expanding in a two-dimensional manner in the row and column directions. The word-line conductive layers 31aa to 31da are separated at a boundary region between the memory blocks MBa.

[Erase Operation of Non-Volatile Semiconductor Storage Device in Second Embodiment]

Figure 13:
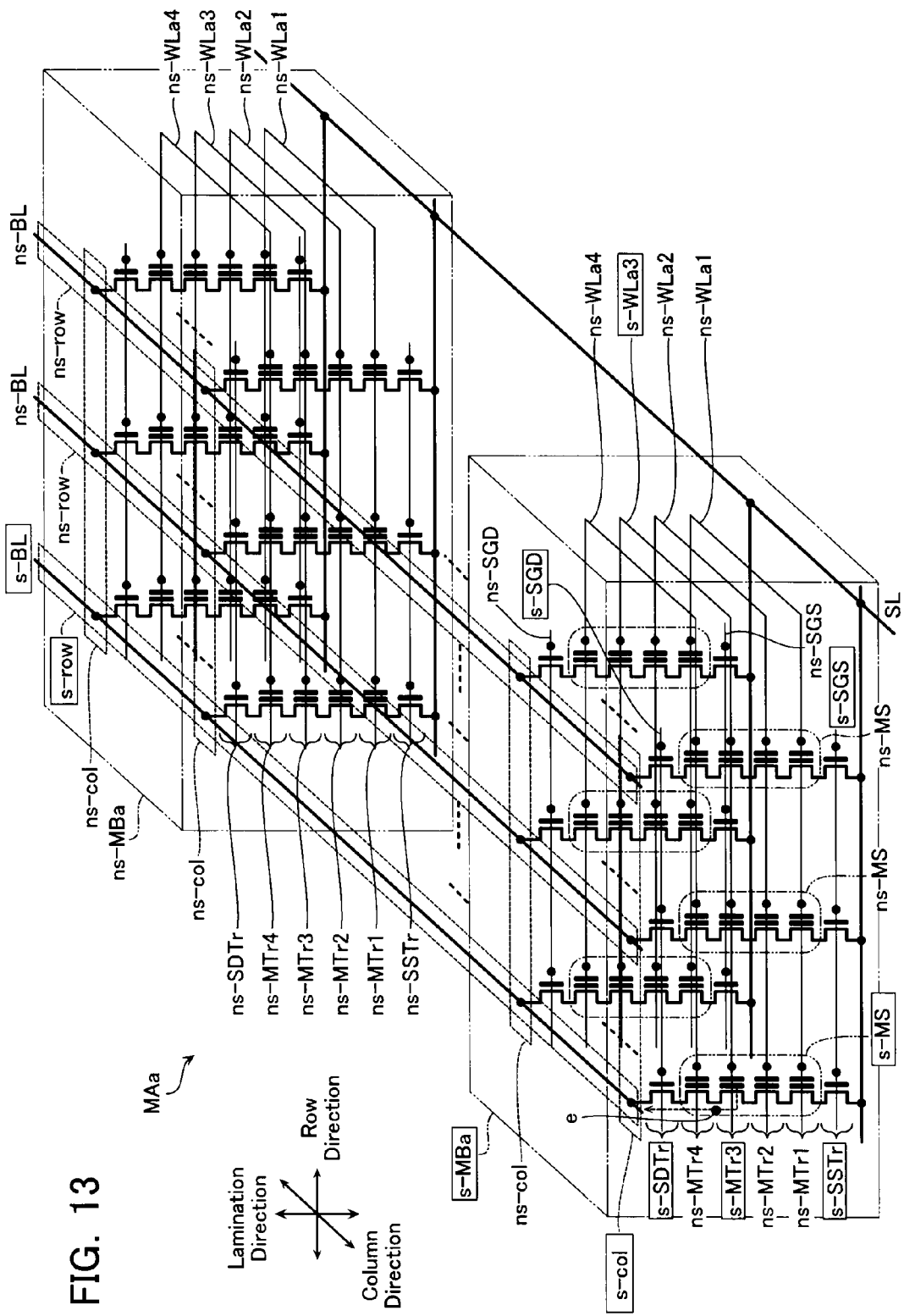
FIG. 13 is a schematic diagram illustrating an erase operation of the non-volatile semiconductor storage device according to the second embodiment.
Figure 15:
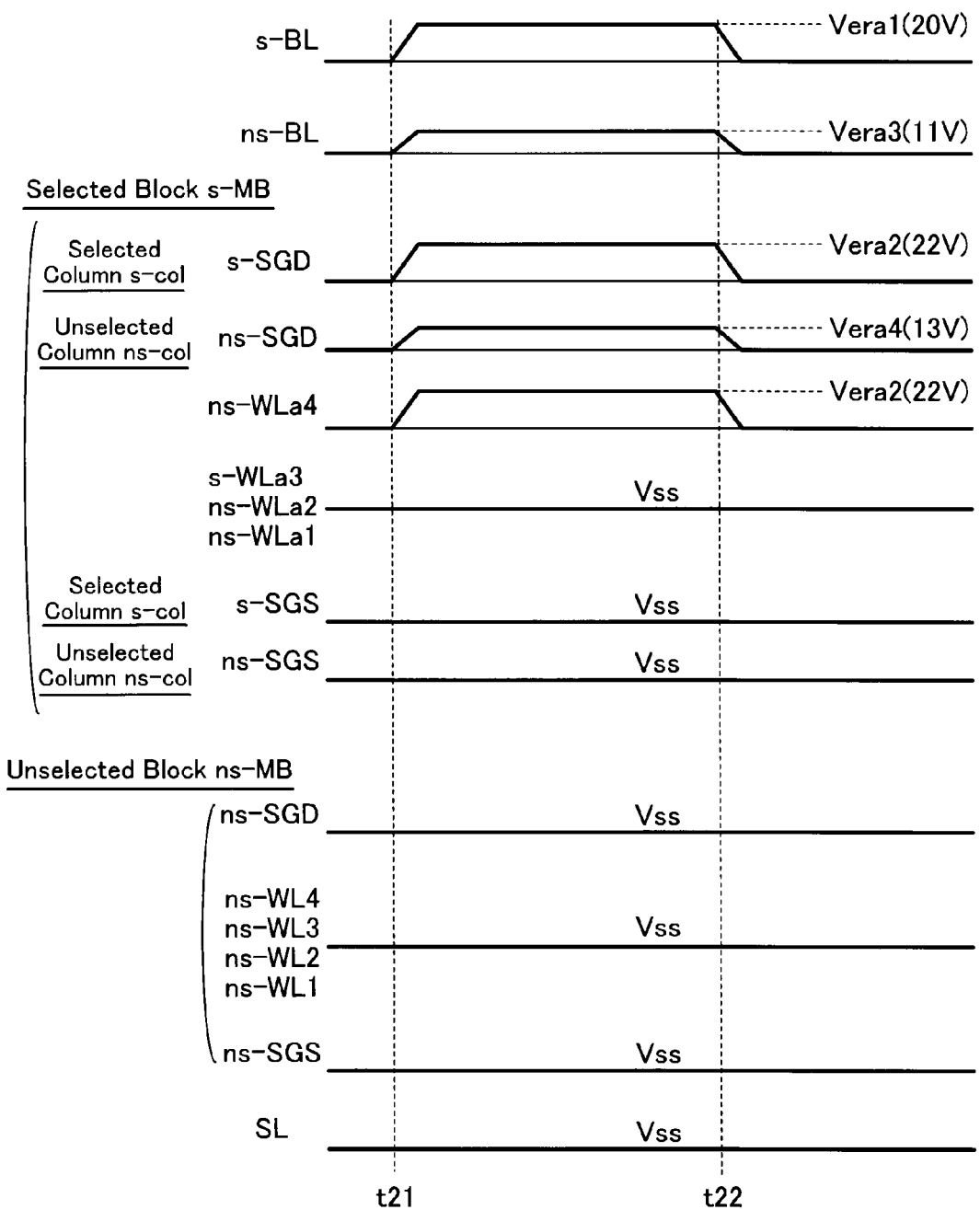
FIG. 15 is a timing chart illustrating the erase operation of the non-volatile semiconductor storage device according to the second embodiment.

Referring now to FIGS. 13 to 15, an erase operation of the non-volatile semiconductor storage device according to the second embodiment will be described below. FIG. 13 schematically illustrates an erase operation of the non-volatile semiconductor storage device of the second embodiment. FIG. 14 illustrates the voltages applied during the erase operation. FIG. 15 is a timing chart of the erase operation.

As illustrated in FIG. 13, in the non-volatile semiconductor storage device of the second embodiment, it is also assumed that the erase operation is performed on a selected memory transistor s-MTr3 in a selected string s-MS, as described in the first embodiment. The selected string s-MS is located in a selected row s-row and in a selected column (hereinafter, a "selected column s-col) within a selected block s-MBa. In addition, as in the first embodiment, the erase operation of the second embodiment is also performed by extracting an electron e from the electric charges accumulation layer of the selected memory transistor s-MTr3, as illustrated in FIG. 13.

The voltages applied to different components during the erase operation in the second embodiment can be represented as shown in FIG. 14. FIG. 14 illustrates the voltages of the respective components in the selected row s-row and the unselected rows ns-row within the selected block s-MBa, and those in the selected row s-row and the unselected rows ns-row within the unselected blocks ns-MBa. FIG. 14 also illustrates the voltages of the respective components in the selected column s-col and the unselected columns ns-col within the selected block s-MBa.

The erase operation will now be described below with reference to the timing chart of FIG. 15. At time t21 of FIG. 15, the control circuit CCa boosts the selected bit line s-BL to a voltage Vera1 (e.g., 20V).

In addition, at time t21 of FIG. 15, the control circuit CCa boosts the selected drain-side gate line s-SGD to a voltage Vera2 (e.g., 22V). In this way, the control circuit CCa causes the selected drain-side transistor s-SDTr to turn on.

In addition, at time t21 of FIG. 15, the control circuit CCa boosts the unselected word line ns-WLa4 in the selected block s-MBa to the voltage Vera2, while maintaining the unselected word lines ns-WLa1, ns-WLa2, and the selected word line s-WLa3 in the selected block s-MBa at the ground voltage (0V). As a result, data is erased from the selected memory transistor s-MTr3.

In addition, at time t21 of FIG. 15, the control circuit CCa boosts the unselected drain-side selection gate line ns-SGD in the selected block s-MBa to a voltage Vera4 (e.g., 13V). Furthermore, at time t21 of FIG. 15, the control circuit CCa boosts the unselected bit lines ns-BL to a voltage Vera3 (e.g., 11V). Accordingly, the voltages applied from the bit lines BL to the unselected strings ns-MS are controlled at the voltage Vera3, which inhibits incorrect write or erase operations.

Then, at time t22 of FIG. 15, the control circuit CCa reduces the voltages of the following components to the ground voltage: the selected bit line s-BL, the unselected bit lines ns-BL, the unselected word lines ns-WLa4, ns-WLa2, ns-WLa1 in the selected blocks-MB, and the selected word line s-WLa3 in the selected block s-MB. At this point, the non-volatile semiconductor storage device according to the second embodiment completes the erase operation.

[Advantages of Non-Volatile Semiconductor Storage Device in Second Embodiment]

The non-volatile semiconductor storage device according to the second embodiment has the same characteristics and advantages as the first embodiment. In addition, in the non-volatile semiconductor storage device of the second embodiment, each memory block MBa has memory strings MS that are arranged in a matrix form in the row and column directions. Furthermore, each memory block MBa is controlled by one first row decoder 140 and one second row decoder 150a. Consequently, the non-volatile semiconductor storage device according to the second embodiment may achieve a further reduction in the area occupied by one first row decoder 140 and one second row decoder 150a for the corresponding memory strings MS, as compared with the first embodiment.

Third Embodiment

[Lamination Structure of Non-Volatile Semiconductor Storage Device in Third Embodiment]

Figure 16:
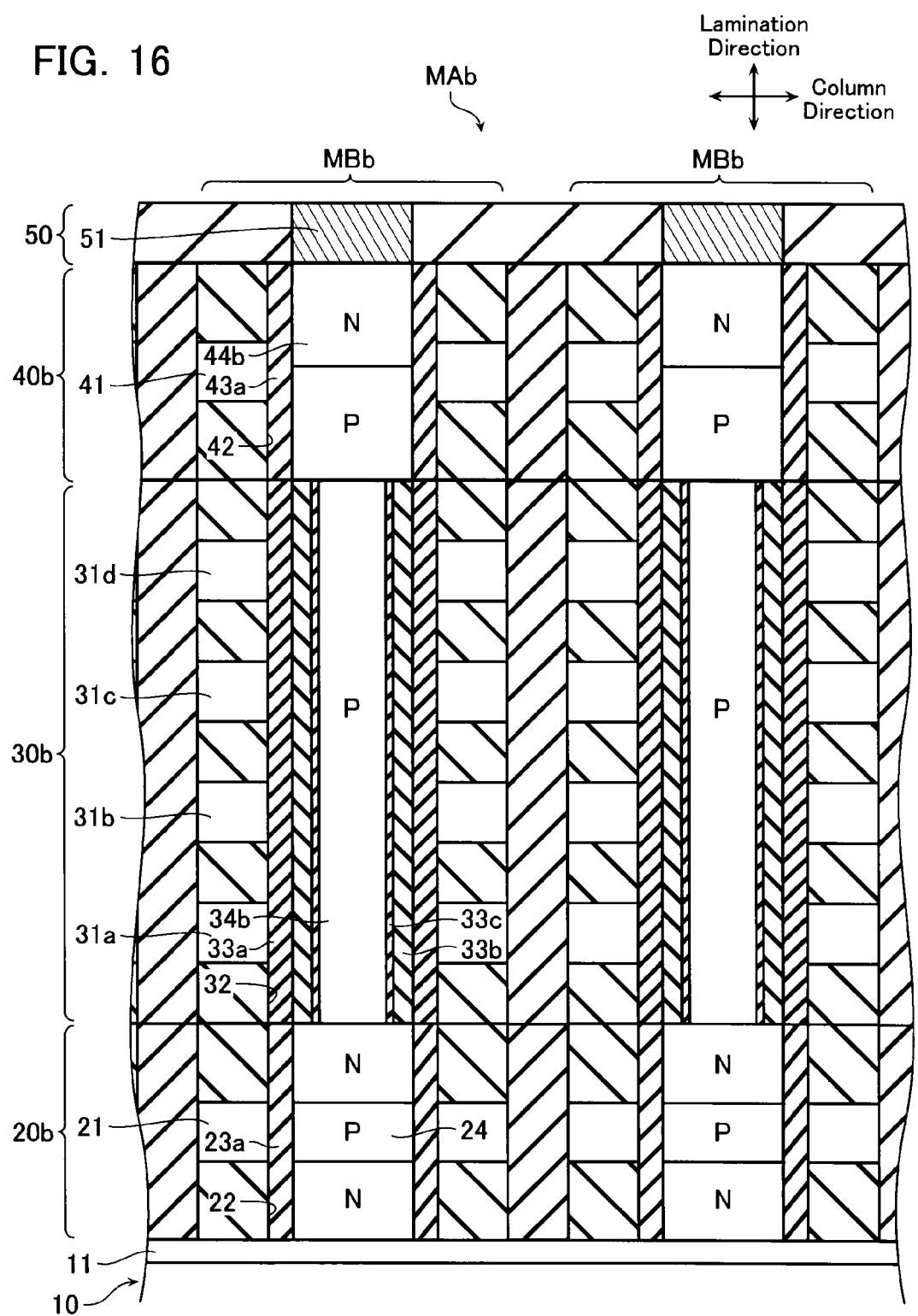
FIG. 16 is a partial cross-sectional view of a non-volatile semiconductor storage device according to a third embodiment.

Referring now to FIG. 16, a lamination structure of a non-volatile semiconductor storage device according to a third embodiment will be described below. The third embodiment is different from the first and second embodiments in that it uses a so-called GIDL (Gate Induced Drain Leakage) current for erase operation. FIG. 16 is a partial cross-sectional view of the non-volatile semiconductor storage device of the third embodiment. While the non-volatile semiconductor storage device of the third embodiment has the same circuit configuration as the first embodiment (see FIG. 1), it differs from the first embodiment in how memory cell arrays are laminated and how an erase operation is performed. This is because it utilizes a GIDL current. Note that the same reference numerals represent the same components as the first and second embodiments, and description thereof will be omitted in the third embodiment.

As illustrated in FIG. 16, the non-volatile semiconductor storage device of the third embodiment comprises a memory cell array MAb including memory blocks MBb that are different from the first and second embodiments. Each memory block MBb has a source-side selection transistor layer 20b, a memory transistor layer 30b, and a drain-side selection transistor layer 40b.

As illustrated in FIG. 16, the source-side selection transistor layer 20b has source-side gate insulation layers 23a different from the first embodiment. Note that according to the third embodiment, a lower voltage is applied between the sources and drains of the source-side selection transistors SSTr than in the first and second embodiments. Consequently, the source-side gate insulation layers 23a are configured to have a lower breakdown voltage than in the first and second embodiments.

As illustrated in FIG. 16, the memory transistor layer 30b has memory columnar semiconductor layers 34b different from the first embodiment. The memory columnar semiconductor layers 34b are of p-type in their entirety.

As illustrated in FIG. 16, the drain-side selection transistor layer 40b has drain-side gate insulation layers 43a different from the first embodiment. Note that according to the third embodiment, a lower voltage is applied between the sources and drains of the drain-side selection transistors SDTr than in the first and second embodiments. Consequently, the drain-side gate insulation layers 43a are configured to have a lower breakdown voltage than in the first and second embodiments. As illustrated in FIG. 16, the drain-side selection transistor layer 40b has drain-side columnar semiconductor layers 44b different from the first embodiment. Each drain-side columnar semiconductor layer 44b has the upper portion of n-type and the lower portion of p-type. That is, each drain-side columnar semiconductor layer 44b has a p-type layer in contact with the top surface of a respective memory columnar semiconductor layer 34b, and an n-type layer located on the p-type layer.

In the above-mentioned lamination structure of the non-volatile semiconductor storage device of the third embodiment, the n-type upper portion of each source-side columnar semiconductor layer 24 prevents any holes H generated by a GIDL current from flowing into the diffusion layer 11 (source line SL).

According to the third embodiment, an erase operation is performed by injecting holes H generated by a GIDL current into the electric charge storage layer 33b of the selected memory transistor s-MTr3 via the above-mentioned p-type memory columnar semiconductor layer 34*b*. In addition, the upper portion of each source-side columnar semiconductor layer 24 is formed to be of n-type. Accordingly, each memory columnar semiconductor layer 34*b* is maintained at a certain voltage.

[Erase Operation of Non-Volatile Semiconductor Storage Device in Third Embodiment]

Figure 17:
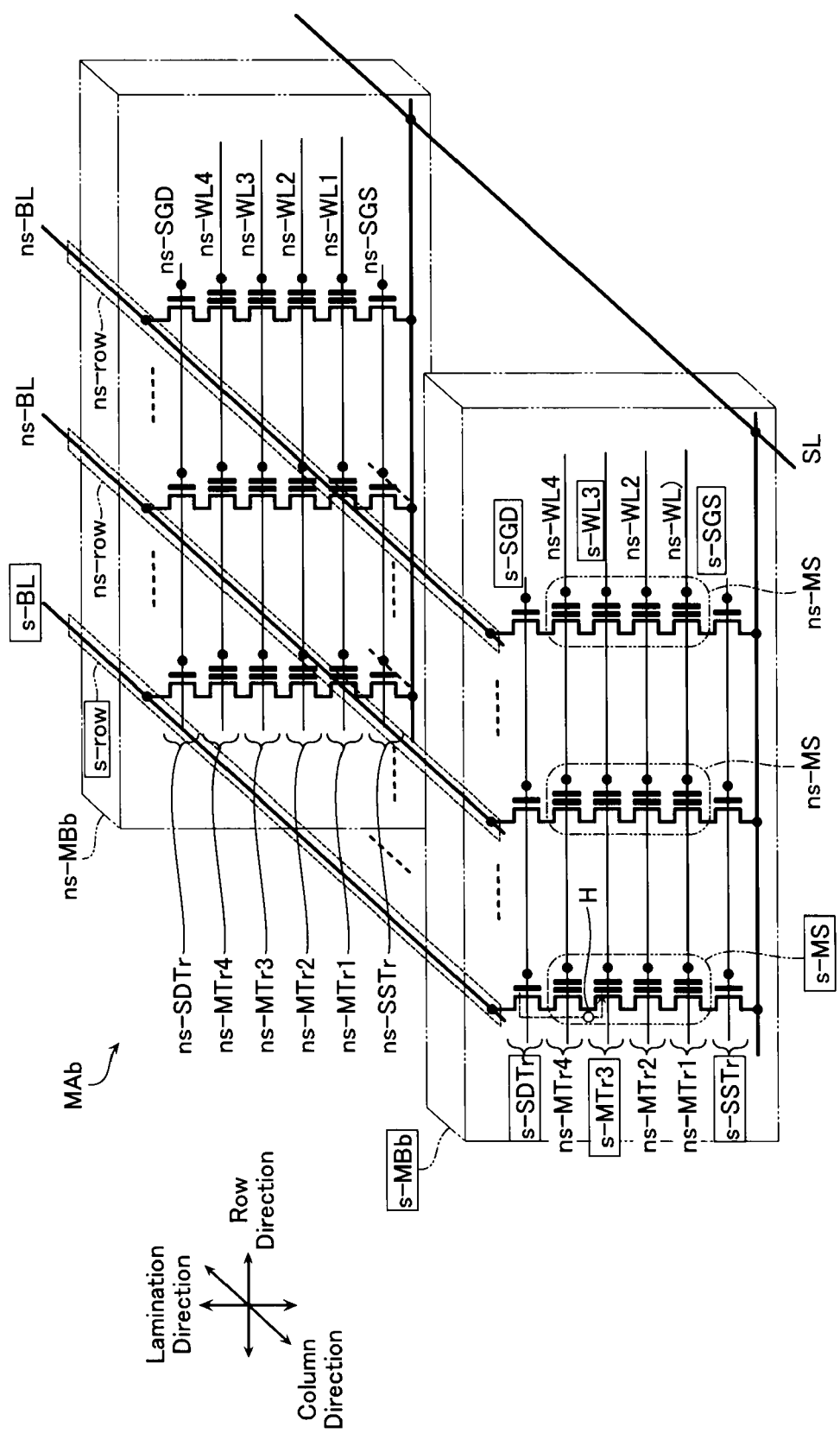
FIG. 17 is a schematic diagram illustrating an erase operation of the non-volatile semiconductor storage device according to the third embodiment.
Figure 19:
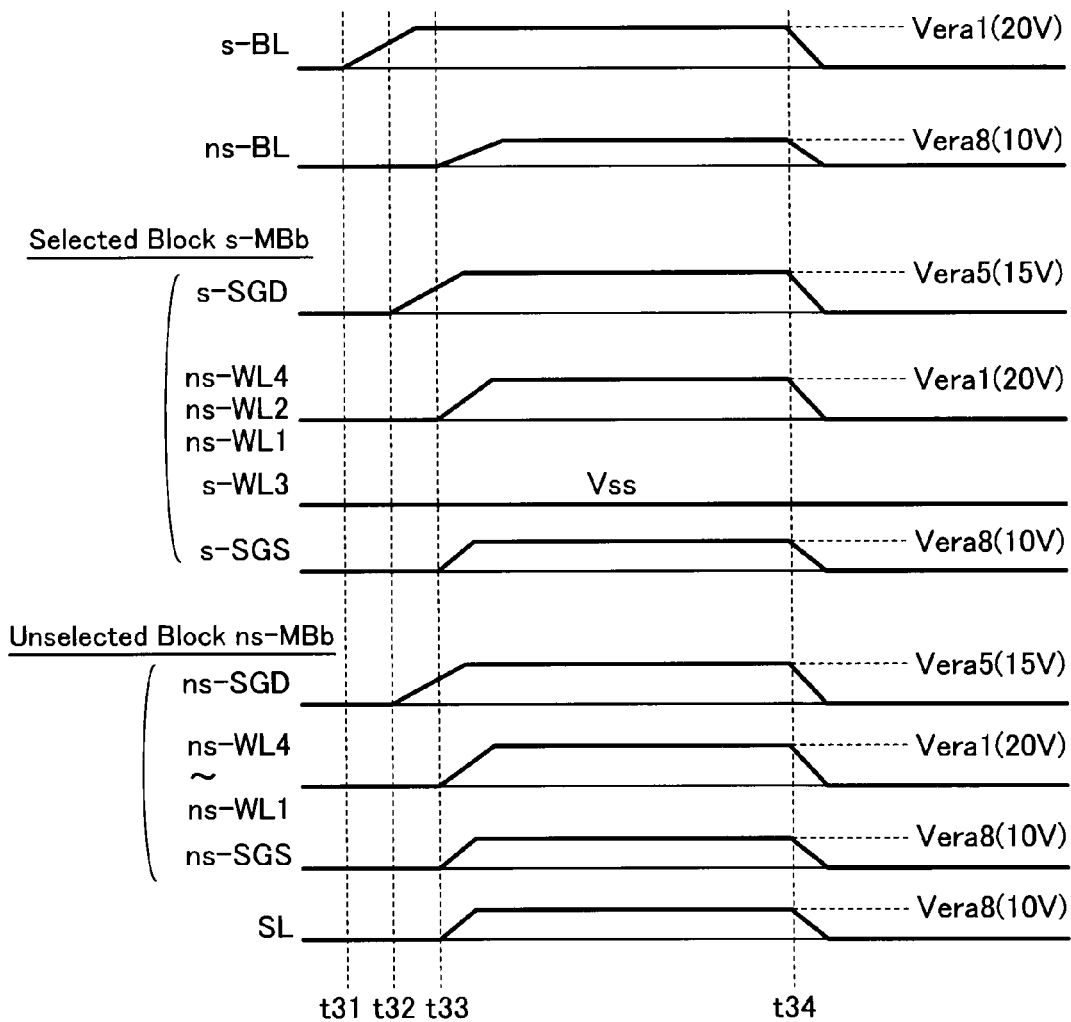
FIG. 19 is a timing chart illustrating the erase operation of the non-volatile semiconductor storage device according to the third embodiment.

Referring now to FIGS. 17 to 19, an erase operation of the non-volatile semiconductor storage device according to the third embodiment will be described below. FIG. 17 schematically illustrates an erase operation of the non-volatile semiconductor storage device of the third embodiment. FIG. 18 illustrates the voltages applied during the erase operation. FIG. 19 is a timing chart of the erase operation.

As illustrated in FIG. 17, in the non-volatile semiconductor storage device of the third embodiment, it is also assumed that the erase operation is performed on a selected memory transistor s-MTr3 in a selected string s-MS, as described in the first embodiment. The selected string s-MS is located in a selected row s-row within a selected block s-MBb. In addition, unlike the first and second embodiments, the erase operation of the third embodiment is performed by injecting the holes H generated by the GIDL current into the electric charge storage layer of the selected memory transistor s-MTr3. The GIDL current is caused by creating a higher electric field at the end of the drain-side selection gate line SGD (the gate of the drain-side selection transistor SDTr) on the bit line BL side.

The voltages applied to different components during the erase operation in the third embodiment can be represented as shown in FIG. 18. FIG. 18 illustrates the voltages of the respective components in the selected row s-row and the unselected rows ns-row within the selected block s-MBb, and those in the selected row s-row and the unselected rows ns-row within the unselected blocks ns-MBb.

The erase operation of this embodiment will now be described with reference to FIG. 19. Firstly, at time t31 of FIG. 19, the control circuit CC boosts the selected bit line s-BL to a voltage Vera1 (e.g., 20V). Then, at time t32 of FIG. 19, the control circuit CC boosts the selected drain-side gate line s-SGD in the selected block s-MBb, as well as the unselected drain-side gate lines ns-SGD in the unselected blocks ns-MBb to a voltage Vera5 (e.g., 15V). In this case, such a potential difference between the voltage Vera1 and the voltage Vera5 causes a current (GIDL current) flowing from the n-type layer of a drain-side columnar semiconductor layer 44*b* that is located near the drain-side gate insulation layer 43*a* into the p-type layer of the drain-side columnar semiconductor layer 44*b*. This causes a GIDL current in the memory strings MS in the selected row s-row.

Subsequently, at time t33 of FIG. 19, the control circuit CC boosts the unselected word lines ns-WL1, ns-WL2, and ns-WL4 to the voltage Vera1 (e.g., 20V) while maintaining the selected word line s-WL3 at 0V, causing the unselected memory transistors ns-MTr1, ns-MTr2, and ns-MTr4 to turn on. In this case, such a potential difference between the potential of the body of the selected memory string s-MS (voltage Vera1) and the potential of the selected word line s-WL3 (ground voltage Vss) causes the holes H generated by a GIDL current to be injected into the electric charge storage layer of the selected memory transistor s-MTr3. As a result, data is erased from the selected memory transistor s-MTr3. In addition, while the GIDL current is caused in the memory strings MS in the selected row s-row within the unselected blocks ns-MBb, the erase operation will not be performed because the word lines WL1 to WL4 are maintained at the voltage Vera1. On the other hand, no GIDL current is caused in the memory strings MS in the unselected rows ns-row because the unselected bit lines ns-BL are maintained at a voltage Vera8 (e.g., 10V).

In addition, at time t33 of FIG. 19, the control circuit CC boosts the selected source-side gate line s-SGS, the unselected source-side gate lines ns-SGS, and the source line SL to the voltage Vera8 (e.g., 10V). This allows the source-side selection transistors SDTr to be maintained in off states and the body of each of memory transistors MTr1 to MTr4 to be maintained at a high voltage. Furthermore, through the above-mentioned operation, the gates of the source-side selection transistors SSTr are not applied with any high voltage, and so they cannot be broken down.

Then, at time t34 of FIG. 19, the control circuit CC reduces the voltages of all wirings to the ground voltage. At this point, the non-volatile semiconductor storage device according to the third embodiment completes the erase operation.

[Advantages of Non-Volatile Semiconductor Storage Device in Third Embodiment]

The non-volatile semiconductor storage device according to the third embodiment has the same characteristics and advantages as the first embodiment. In addition, since the non-volatile semiconductor storage device of the third embodiment uses the GIDL current to perform the erase operation, the source-side selection transistors SSTr and the drain-side selection transistors SDTr cannot be applied with a higher breakdown voltage than in the first and second embodiments. Accordingly, the source-side selection transistors SSTr and the drain-side selection transistors SDTr of this embodiment do not have to include high breakdown voltage MOS transistors. Therefore, the non-volatile semiconductor storage device according to the third embodiment may be manufactured at lower costs than the first and second embodiments.

Fourth Embodiment

[Erase Operation of Non-Volatile Semiconductor Storage Device in Fourth Embodiment]

Referring now to FIG. 20, an erase operation of a non-volatile semiconductor storage device according to a fourth embodiment will be described below. FIG. 20 illustrates the voltages applied during the erase operation of the non-volatile semiconductor storage device of the fourth embodiment. While the non-volatile semiconductor storage device of the fourth embodiment has the same circuit configuration and lamination structure as the third embodiment, the erase operation differs. Note that the same reference numerals represent the same components as the first to third embodiments, and description thereof will be omitted in the fourth embodiment.

As indicated by "Unselected Blocks ns-MBb" in FIG. 20, at time t33, the non-volatile semiconductor storage device of the fourth embodiment boosts the unselected word lines WL1 to WL4 in the unselected blocks ns-MBb to a voltage Vera9 (e.g., 12V). In this regard, the fourth embodiment is different from the third embodiment. In this case, the voltage Vera9 (12V) is the voltage Vera8 (10V) plus a threshold voltage Vth (2V).

[Advantages of Non-Volatile Semiconductor Storage Device in Fourth Embodiment]

The non-volatile semiconductor storage device according to the fourth embodiment has the same characteristics and advantages as the third embodiment using the GIDL current. In addition, the non-volatile semiconductor storage device according to the fourth embodiment may reduce the voltage applied to the unselected word lines ns-WL1 to ns-WL4 in the unselected blocks ns-MBb, as compared with the third embodiment, which may result in a reduction in the load on the word-line driving circuit 120.

Fifth Embodiment

[Erase Operation of Non-Volatile Semiconductor Storage Device in Fifth Embodiment]

Referring now to FIG. 21, an erase operation of a non-volatile semiconductor storage device according to a fifth embodiment will be described below. FIG. 21 illustrates the voltages applied during the erase operation of the non-volatile semiconductor storage device of the fifth embodiment. While the non-volatile semiconductor storage device of the fifth embodiment has the same circuit configuration and lamination structure as the third embodiment, the erase operation differs. Note that the same reference numerals represent the same components as the first to fourth embodiments, and description thereof will be omitted in the fifth embodiment.

As indicated by "Unselected Blocks ns-MBb" in FIG. 21, at time t33, the non-volatile semiconductor storage device of the fifth embodiment boosts the unselected word lines ns-WL1 to ns-WL4 in the unselected blocks ns-MBb to a voltage Vera10 (e.g., 15V). In this regard, the fifth embodiment is different from the third embodiment. In this case, the voltage Vera10 (15V) is an intermediate voltage between the voltage Vera8 (10V) and the voltage Vera1 (20V).

[Advantages of Non-Volatile Semiconductor Storage Device in Fifth Embodiment]

The non-volatile semiconductor storage device according to the fifth embodiment has the same characteristics and advantages as the third embodiment using a GIDL current. In addition, according to the fifth embodiment, the unselected word lines ns-WL1 to ns-WL4 in the unselected blocks ns-MBb are boosted to the voltage Vera10 (e.g., 15V). Accordingly, the non-volatile semiconductor storage device according to the fifth embodiment may reduce incorrect write operations than in the third and fourth embodiments.

Sixth Embodiment

[Circuit Configuration of Non-Volatile Semiconductor Storage Device in Sixth Embodiment]

Figure 22:
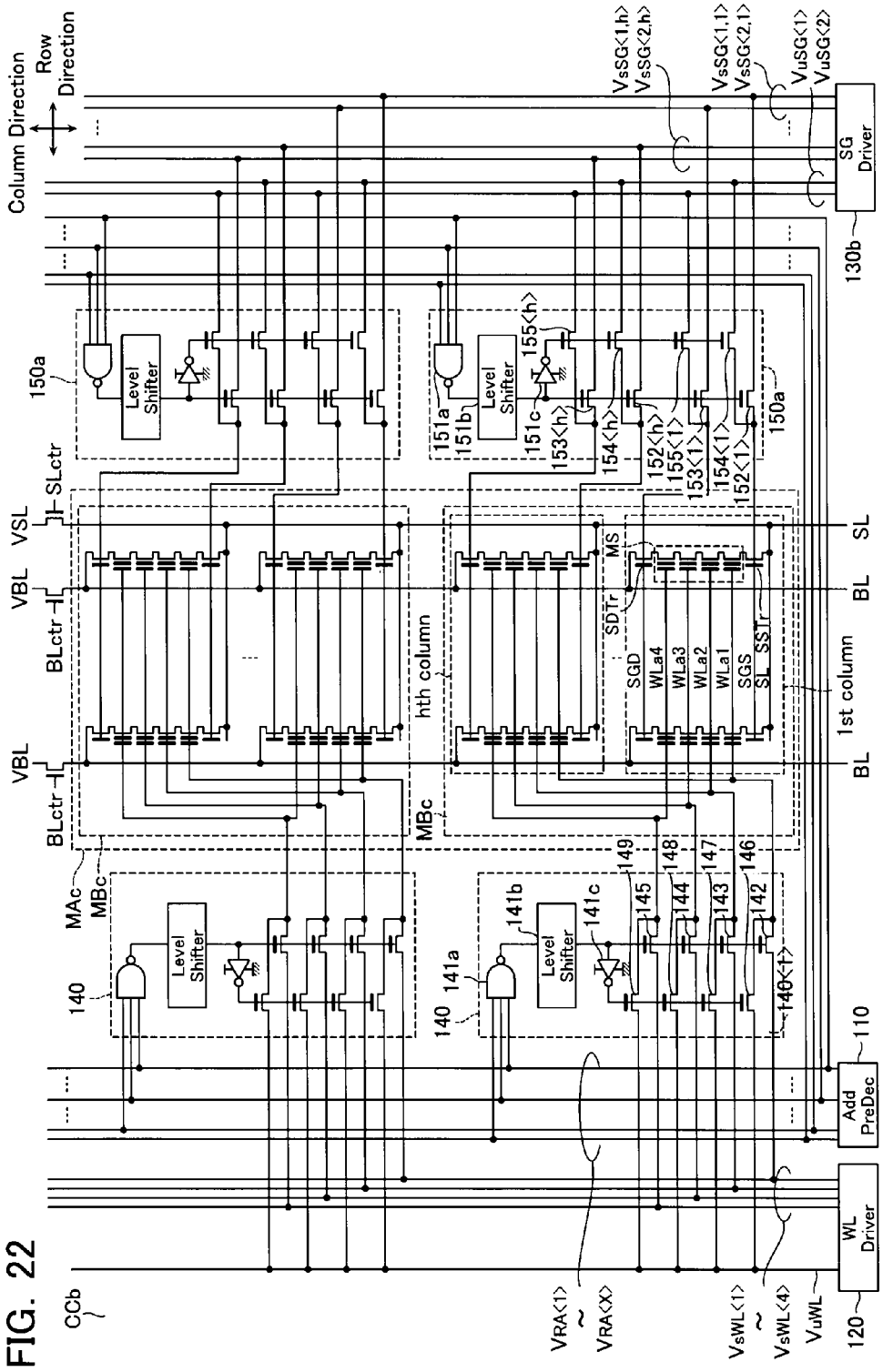
FIG. 22 is a circuit diagram of a non-volatile semiconductor storage device according to a sixth embodiment.

Referring now to FIG. 22, a circuit configuration of the non-volatile semiconductor storage device according to the sixth embodiment will be described below. FIG. 22 is a circuit diagram of the non-volatile semiconductor storage device of the sixth embodiment. The non-volatile semiconductor storage device of the sixth embodiment has substantially the same circuit configuration as the second embodiment. In the sixth embodiment, the GIDL current is also used for erase operation as in the third to fifth embodiments. Note that the same reference numerals represent the same components as the first to fifth embodiments, and description thereof will be omitted in the sixth embodiment.

As illustrated in FIG. 22, the non-volatile semiconductor storage device of the sixth embodiment comprises a memory cell array MAc and a selection-gate-line driving circuit 130b. The memory cell array MAc has the same circuit configuration as that described in the second embodiment. That is, it has the same circuit configuration as the second embodiment in that the word lines WLa1 to WLa4 of the sixth embodiment are commonly connected to the gates of the memory transistors MTr1 to MTr4 arranged in a matrix form in the row and column directions, respectively. However, the memory cell array MAc has a different lamination structure from that described in the second embodiment. The lamination structure of the memory cell array MAc will be described later. The selection-gate-line driving circuit 130b outputs signals $V_{usG<1>}$ and $V_{usG<2>}$, instead of the signal $V_{usG}$ in the second embodiment. The signal $V_{usG<1>}$ is supplied to the unselected source-side gate lines ns-SGS. The signal $V_{usG<2>}$ is supplied to the unselected drain-side gate lines ns-SGD.

[Lamination Structure of Non-Volatile Semiconductor Storage Device in Sixth Embodiment]

Figure 23:
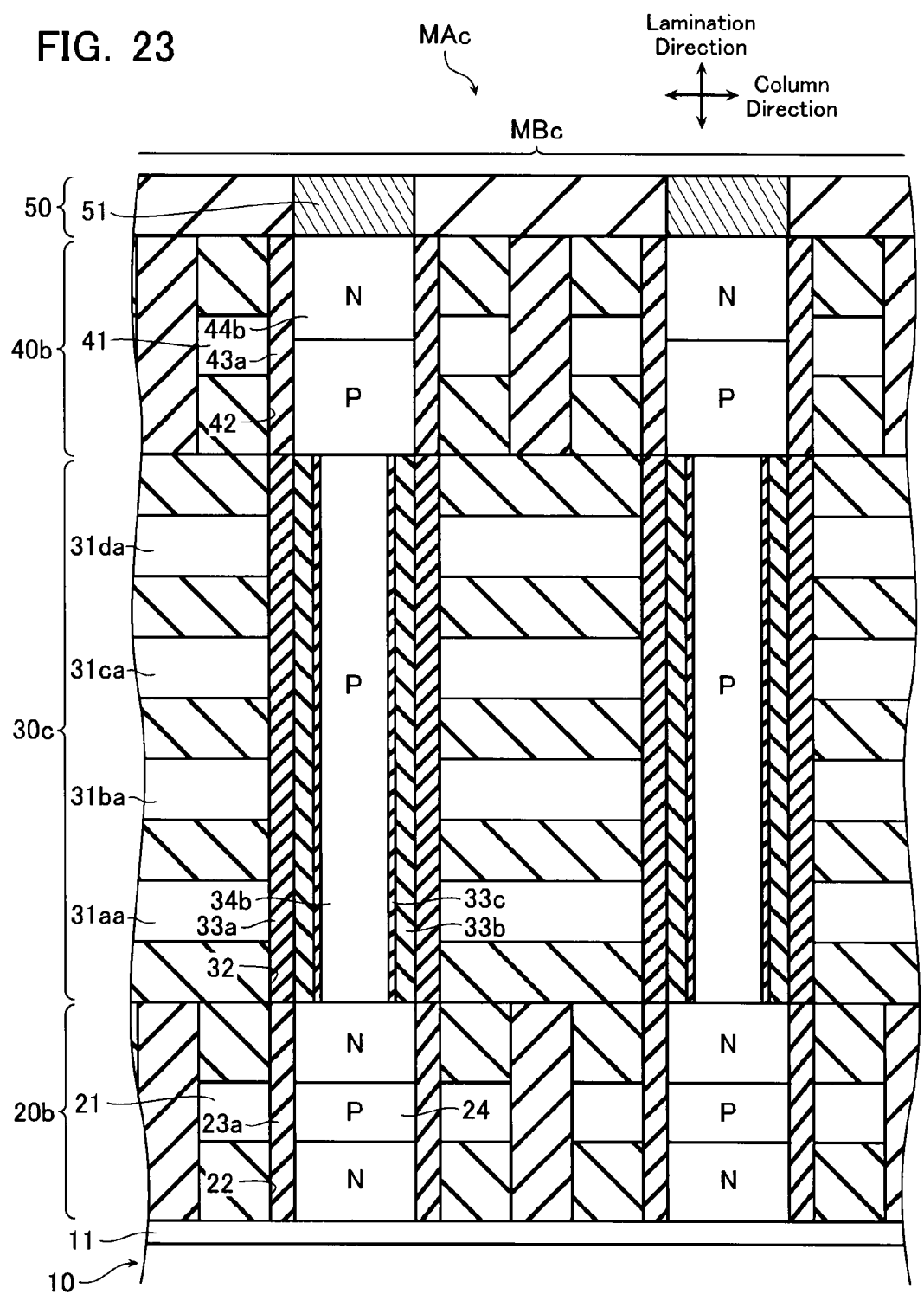
FIG. 23 is a partial cross-sectional view of the non-volatile semiconductor storage device according to the sixth embodiment.

Referring now to FIG. 23, a lamination structure of the non-volatile semiconductor storage device according to the sixth embodiment will be described below. FIG. 23 is a partial cross-sectional view of the non-volatile semiconductor storage device of the sixth embodiment.

As illustrated in FIG. 23, the non-volatile semiconductor storage device of the sixth embodiment has memory blocks MBc different from the first to fifth embodiments. Each memory block MBc has a memory transistor layer 30c.

As illustrated in FIG. 23, the memory transistor layer 30c has word-line conductive layers 31aa to 31da and memory columnar semiconductor layers 34b. In the sixth embodiment, the word-line conductive layers 31aa to 31da (FIG. 23) are the same as those in the second embodiment (FIG. 12), while the memory columnar semiconductor layers 34b (FIG. 23) are the same as those in the third embodiment (FIG. 16).

[Erase Operation of Non-Volatile Semiconductor Storage Device in Sixth Embodiment]

Figure 24:
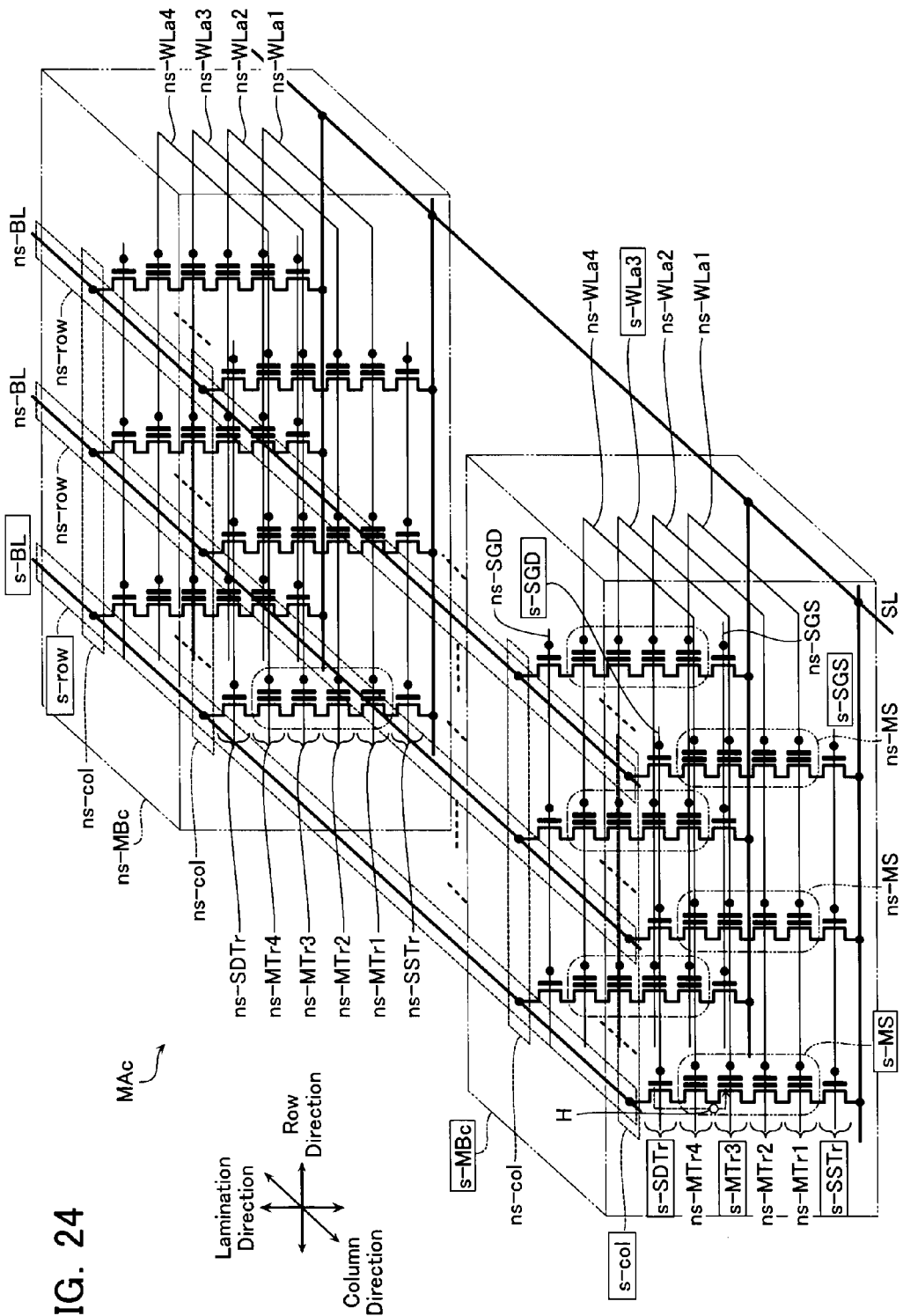
FIG. 24 is a schematic diagram illustrating an erase operation of the non-volatile semiconductor storage device according to the sixth embodiment.
Figure 26:
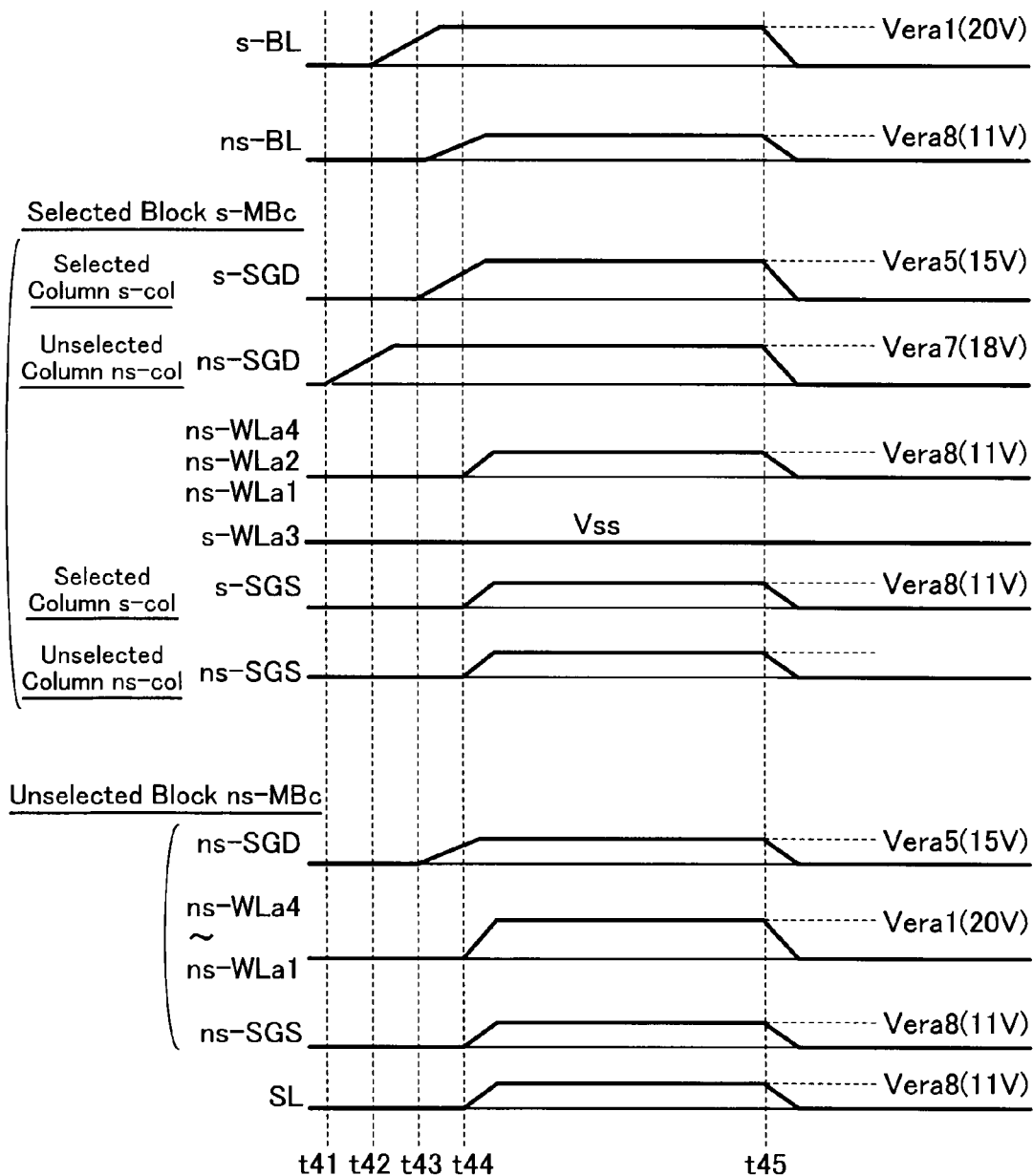
FIG. 26 is a timing chart illustrating the erase operation of the non-volatile semiconductor storage device according to the sixth embodiment.

Referring now to FIGS. 24 to 26, an erase operation of the non-volatile semiconductor storage device according to the sixth embodiment will be described below. FIG. 24 schematically illustrates an erase operation of the non-volatile semiconductor storage device of the sixth embodiment. FIG. 25 illustrates the voltages applied during the erase operation. FIG. 26 is a timing chart of the erase operation.

As illustrated in FIG. 24, in the sixth embodiment, it is assumed that the erase operation is performed on a selected memory transistor s-MTr3 in a selected string s-MS. The selected string s-MS is located in a selected row s-row and in a selected column s-col within a selected block MBc. In addition, the erase operation of the sixth embodiment is performed by injecting the holes H generated by the GIDL current into the electric charge storage layer of the selected memory transistor s-MTr3, as illustrated in FIG. 24.

The voltages applied to different components during the erase operation in the sixth embodiment can be represented as shown in FIG. 25. FIG. 25 illustrates the voltages of the respective components in the selected row s-row and the unselected rows ns-row within the selected block s-MBc, and those in the selected row s-row and the unselected rows ns-row within the unselected blocks ns-MBc. FIG. 25 also illustrates the voltages of the respective components in the selected column s-col and the unselected columns ns-col within the selected block s-MBc.

The erase operation will now be described below with reference to the timing chart of FIG. 26. Firstly, at time t41 of FIG. 26, a control circuit CCb boosts the unselected drain-side gate lines ns-SGD to a voltage Vera7 (e.g., 18V). Such a potential difference between the voltage Vera1 and the voltage Vera7 inhibits the occurrence of the GIDL current. Thus, as described below, no GIDL current is caused at time t42 in those memory strings MS that are located in the unselected columns ns-col within the selected block s-MBc.

Then, at time t42 of FIG. 26, the control circuit CCb boosts the selected bit line s-BL to the voltage Vera1 (e.g., 20V). Subsequently, at time t43 of FIG. 26, the control circuit CCb boosts the selected drain-side gate line s-SGD to a voltage Vera5 (e.g., 15V). In addition, at time t43 of FIG. 26, the control circuit CCb boosts the unselected drain-side gate lines ns-SGD in the unselected blocks ns-MBc to the voltage Vera5. This causes a GIDL current in the selected memory string s-MS.

Subsequently, at time t44 of FIG. 26, the control circuit CCb boosts the unselected word lines ns-WLa1 to ns-WLa4 to the voltage Vera1 (e.g., 20V) while maintaining the selected word line s-WLa3 at 0V, causing the unselected memory transistors ns-MTr1, ns-MTr2, . . . , ns-MTr4 to turn on. As a result, data is erased from the selected memory transistor s-MTr3.

In addition, at time t44 of FIG. 26, the control circuit CCb boosts the selected source-side gate line s-SGS, the unselected source-side gate lines ns-SGS, and the source line SL to the voltage Vera8 (e.g., 10V). Accordingly, the body of each of memory transistors MTr1 to MTr4 is maintained at a certain voltage.

Then, at time t45 of FIG. 26, the control circuit CCb reduces the voltages of all wirings to the ground voltage Vss (0V). At this point, the non-volatile semiconductor storage device according to the sixth embodiment completes the erase operation.

[Advantages of Non-Volatile Semiconductor Storage Device in Sixth Embodiment]

The non-volatile semiconductor storage device according to the sixth embodiment has the same characteristics and advantages as the third embodiment using the GIDL current. Furthermore, the non-volatile semiconductor storage device of the sixth embodiment has the same characteristics as the second embodiment, and hence it may achieve a further reduction in the area occupied by one first row decoder 140 and one second row decoder 150a for the corresponding memory strings MS, as compared with the third to fifth embodiments.

Seventh Embodiment

[Write Operation of Non-Volatile Semiconductor Storage Device in Seventh Embodiment]

Figure 27:
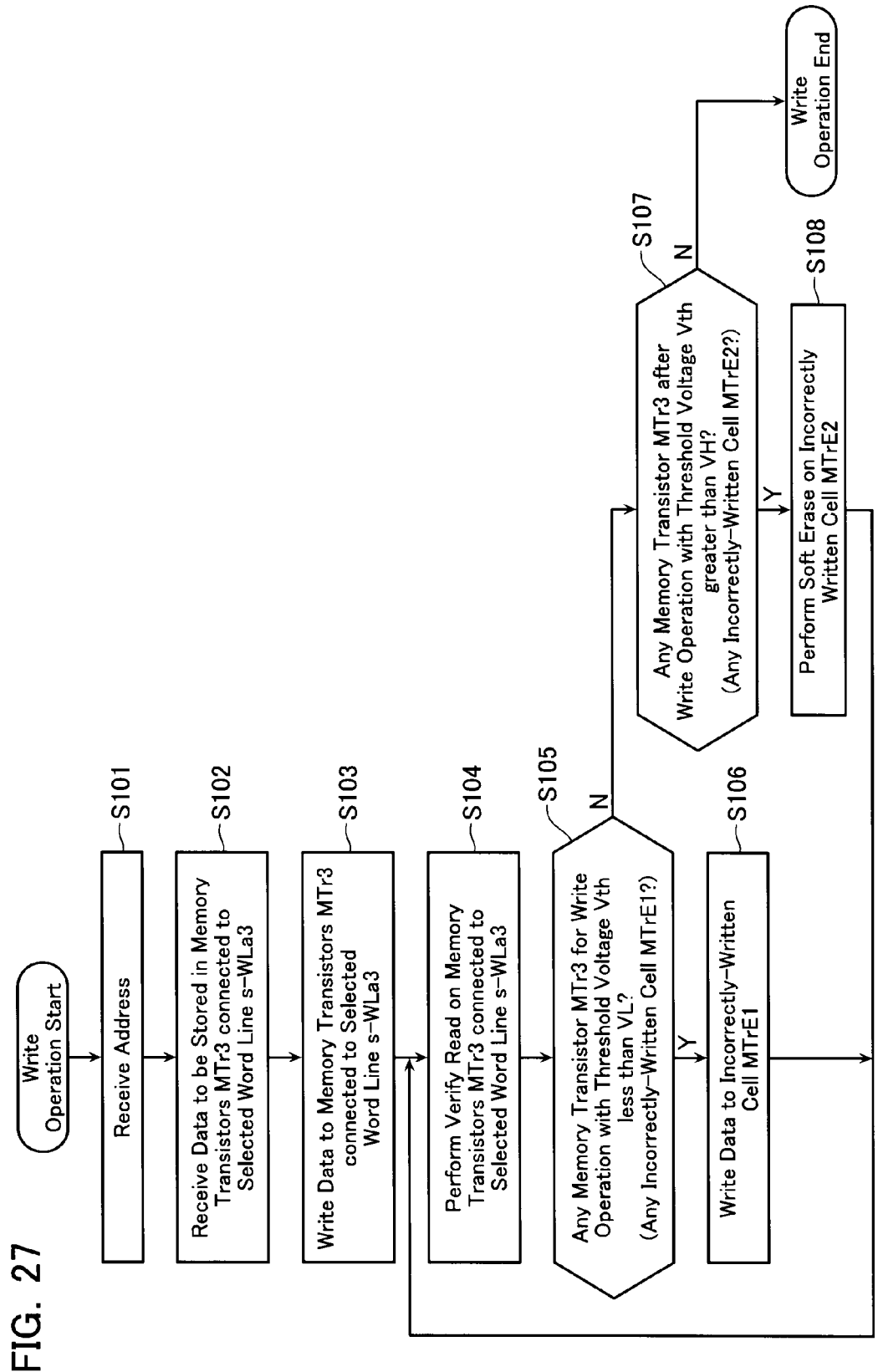
FIG. 27 is a flowchart illustrating a write operation of a non-volatile semiconductor storage device according to a seventh embodiment.
Figure 28:
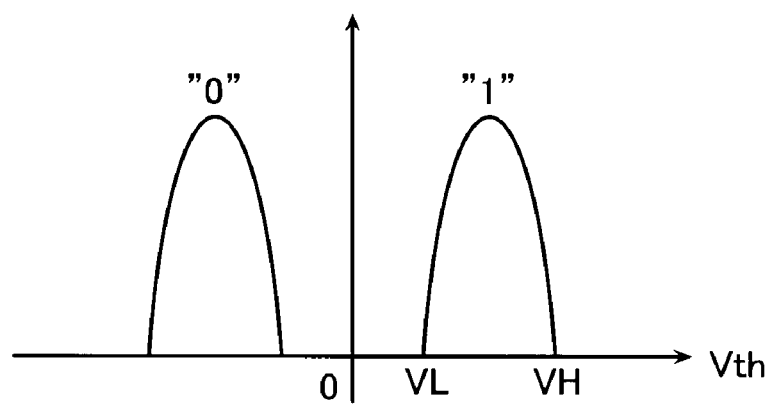
FIG. 28 illustrates a threshold voltage Vth in the write operation.

Referring now to FIGS. 27 and 28, a write operation of a non-volatile semiconductor storage device according to a seventh embodiment will be described below. FIG. 27 is a flowchart illustrating a write operation of the non-volatile semiconductor storage device of the seventh embodiment. FIG. 28 illustrates the threshold voltage Vth in the write operation. The non-volatile semiconductor storage device according to the seventh embodiment has the same circuit configuration and lamination structure as the sixth embodiment, and performs an erase operation in the same way as the sixth embodiment. Furthermore, the non-volatile semiconductor storage device of the seventh embodiment performs a write operation including soft erase (which is an operation for correcting any incorrect write) as illustrated in FIG. 27. In this regard, the non-volatile semiconductor storage device of the seventh embodiment is different from the sixth embodiment. Note that the same reference numerals represent the same components as the first to sixth embodiments, and description thereof will be omitted in the seventh embodiment.

Firstly, as illustrated in FIG. 27, the control circuit CCb receives an address for write operation (step S101). Then, the control circuit CCb receives data to be stored in the memory transistors MT3 connected to the selected word line s-WLa3 (step S102). Subsequently, the control circuit CCb writes the data to the memory transistors MTr3 connected to the selected word line s-WLa3 (step S103). Thereafter, the control circuit CCb performs verify read on the memory transistors MTr3 connected to the selected word line s-WLa3 (step S104).

Subsequently, the control circuit CCb determines whether there is an incorrectly-written cell MTrE1 (step S105). In this case, an incorrectly-written cell MTrE1 represents one of the memory transistors MTr3 for the write operation that has a threshold voltage Vth less than a voltage VL, as illustrated in FIG. 28.

If it is determined that there exists an incorrectly-written cell MTrE1 ("Y" at step S105), then the control circuit CCb further writes data to that incorrectly-written cell MTrE1 (step S106), and returns to step S104 to repeat the process.

Alternatively, if it is determined that there is no incorrectly-written cell MTrE1 ("N" at step S105), then the control circuit CCb determines whether there is an incorrectly-written cell MTrE2 (step S107). In this case, an incorrectly-written cell MTrE2 represents one of the memory transistors MTr3 for the write operation that has a threshold voltage Vth greater than a voltage VH, as illustrated in FIG. 28.

If it is determined that there exists an incorrectly-written cell MTrE2 ("Y" at step S107), then the control circuit CCb further performs soft erase on the incorrectly-written cell MTrE2 (step S8), and returns to step S104 to repeat the process. In this case, the soft erase means an operation for shifting the threshold Vth to a range that is equal to or more than the voltage VL, and less than the voltage VH. The soft erase is performed using the erase operation as described in the sixth embodiment.

Alternatively, if it is determined that there is no incorrectly-written cell MTrE2 ("N" at step S107), then the control circuit CCb terminates the write operation.

[Advantages of Non-Volatile Semiconductor Storage Device in Seventh Embodiment]

The non-volatile semiconductor storage device according to the seventh embodiment has the same characteristics and advantages as the first embodiment. Furthermore, the non-volatile semiconductor storage device of the seventh embodiment is configured to be able to perform a write operation as described above. Soft erase during the write operation is performed with the erase operation according to the sixth embodiment. Therefore, the non-volatile semiconductor storage device of the seventh embodiment may provide fast soft erase, achieving highly-accurate and fast write operations.

Other Embodiments

While embodiments of the non-volatile semiconductor storage device have been described, the present invention is not intended to be limited to the disclosed embodiments, and various other changes, additions, replacements or the like may be made thereto without departing from the spirit of the invention. For example, the configuration of the seventh embodiment is also applicable to the first to fifth embodiments.

Figure 29:
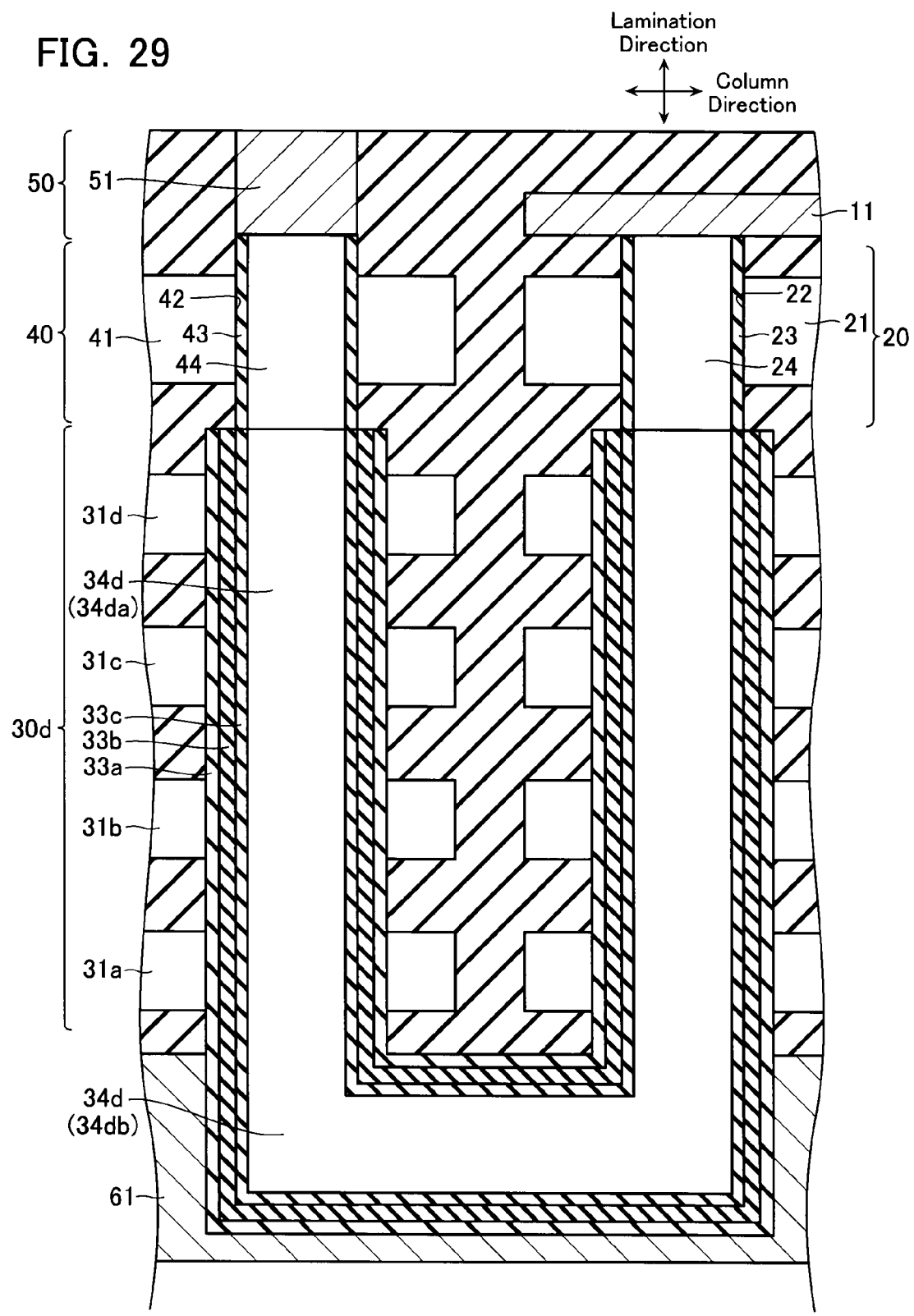
FIG. 29 is a partial cross-sectional view of a non-volatile semiconductor storage device according to another embodiment.

For example, the non-volatile semiconductor storage device according to the first to seventh embodiments comprises the memory columnar semiconductor layers 34 and 34b extending in I-shape (columnar shape). However, the non-volatile semiconductor storage device according to the present invention may have an alternative lamination structure, such as illustrated in FIG. 29. That is, as illustrated in FIG. 29, a non-volatile semiconductor storage device according to another embodiment of the present invention has a memory transistor layer 30d different from the first to seventh embodiments.

The memory transistor layer 30d has U-shaped semiconductor layers 34d formed in U-shape as viewed from the row direction, instead of the memory columnar semiconductor layers 34 and 34b. Each U-shaped semiconductor layer 34d has a pair of columnar portions 34da that extend in a vertical direction to the substrate, and a joining portion 34db that joins the bottom portions of the pair of columnar portions 34da. Each joining portion 34db is formed to be surrounded by a back-gate conductive layer 61 via a block insulation layer 33a, an electric charge storage layer 33b, and a tunnel insulation layer 33c.

The non-volatile semiconductor storage device according to the other embodiment also comprises a source-side selection transistor layer 20 and a drain-side selection transistor layer 40 above the memory transistor layer 30d. In the source-side selection transistor layer 20, the bottom surface of a source-side columnar semiconductor layer 24 is formed in contact with the top surface of one columnar portion 34da of the corresponding U-shaped semiconductor layer 34d. In the drain-side selection transistor layer 40, the bottom surface of a drain-side columnar semiconductor layer 44 is formed in contact with the top surface of the other columnar portion 34da of the corresponding U-shaped semiconductor layer 34d.

What is claimed is:

1. A non-volatile semiconductor storage device comprising:
   a plurality of memory strings each including a plurality of memory transistors connected in series;
   a plurality of first selection transistors each having one end connected to one end of a respective one of the memory strings, each of the first selection transistors being conductive when selecting one of the memory strings;
   a plurality of second selection transistors each having one end connected to the other end of a respective one of the memory strings, each of the second selection transistors being conductive when selecting one of the memory strings; and
   a control circuit performing an erase operation to erase data from a selected one of the memory transistors included in the selected one of the memory strings connected to one end of a selected one of the first selection transistors,
   each of the memory strings comprising:
      a first semiconductor layer having a columnar portion extending in a vertical direction to a substrate, and functioning as a body of each of the plurality of memory transistors;
      an electric charge storage layer surrounding the first semiconductor layer; and
      a first conductive layer surrounding the electric charge storage layer and extending in parallel to the substrate, the first conductive layer functioning as a gate of each of the plurality of memory transistors,
   each of the first selection transistors comprising:
      a second semiconductor layer in contact with one end of the columnar portion and extending in the vertical direction to the substrate, the second semiconductor layer functioning as a body of the first selection transistor;
      a first gate insulation layer surrounding the second semiconductor layer; and
      a second conductive layer surrounding the first gate insulation layer and extending in parallel to the substrate, the second conductive layer functioning as a gate of the first selection transistor,
   each of the second selection transistors comprising:
      a third semiconductor layer in contact with the other end of the columnar portion and extending in the vertical direction to the substrate, the third semiconductor layer functioning as a body of the second selection transistor;
      a second gate insulation layer surrounding the third semiconductor layer; and
      a third conductive layer surrounding the second gate insulation layer and extending in parallel to the substrate, the third conductive layer functioning as a gate of the second selection transistor,
   the second semiconductor layer having a p-type layer in contact with one end of the columnar portion, and an n-type layer located on the p-type layer,
   the third semiconductor layer having an n-type layer in contact with the other end of the columnar portion, a p-type layer located below the n-type layer, and another n-type layer located below the p-type layer,
   the control circuit applying a first voltage to the other end of the selected one of the first selection transistors, then applying a second voltage to the gate of the selected one of the first selection transistors, and then causing the memory transistors other than the selected memory transistor to turn on, and also applying a third voltage to the gate of the selected memory transistor,
   such a potential difference between the first voltage and the second voltage causing a first current flowing from the n-type layer of the second semiconductor layer located near the first gate insulation layer into the p-type layer of the second semiconductor layer, and
   such a potential difference between the first voltage and the third voltage causing holes generated by the first current to be injected into the electric charge storage layer of the selected memory transistor.

2. The non-volatile semiconductor storage device according to claim 1, wherein
   in addition to the application of the third voltage, the control circuit applies a fourth voltage to the other end of an unselected one of the selection transistors, and
   the fourth voltage is on the order of half the third voltage.

3. The non-volatile semiconductor storage device according to claim 1, comprising:
   a first wiring commonly connected to the gates of the memory transistors aligned in a first direction;
   a second wiring commonly connected to the gates of the selection transistors aligned in the first direction; and
   a third wiring commonly connected to the other ends of the selection transistors aligned in a second direction orthogonal to the first direction, wherein
   the first wiring comprises the first conductive layer,
   the second wiring comprises the second conductive layer,
   the third wiring comprises a third conductive layer in contact with a top surface of the second semiconductor layer,
   the first and second conductive layers are formed to extend in the first direction, and formed in a stripe pattern at a certain pitch in the second direction, and
   the third conductive layers are formed to extend in the second direction, and formed in a stripe pattern at a certain pitch in the first direction.

4. The non-volatile semiconductor storage device according to claim 1, further comprising: a plurality of memory blocks each including a plurality of the memory strings, wherein
   the control circuit performs the erase operation on a selected one of the memory strings included in a selected one of the memory blocks.

5. The non-volatile semiconductor storage device according to claim 4, wherein
   the control circuit applies a fifth voltage to the gates of the memory transistors other than the selected memory transistor in the selected one of the memory blocks, and also applies the fifth voltage to the gates of the memory transistors in an unselected one of the memory blocks, and the fifth voltage is a voltage that causes the memory transistors to turn on.

6. The non-volatile semiconductor storage device according to claim 4, wherein the control circuit applies a fifth voltage to the gates of the memory transistors other than the selected memory transistor in the selected one of the memory blocks, and applies a sixth voltage to the gates of the memory transistors in an unselected one of the memory blocks, the fifth voltage is a voltage that causes the memory transistors to turn on, and the sixth voltage is smaller than the fifth voltage.

7. The non-volatile semiconductor storage device according to claim 1, comprising:

a first wiring commonly connected to the gates of the memory transistors arranged in a matrix form in a first direction and a second direction orthogonal to the first direction;

a second wiring commonly connected to the gates of the first selection transistors aligned in the first direction; and a third wiring commonly connected to the other ends of the first selection transistors aligned in the second direction, wherein the first wiring comprises the first conductive layer, the second wiring comprises the second conductive layer, the third wiring comprises a third conductive layer in contact with a top surface of the second semiconductor layer, the first conductive layer is formed in a plate-like form so as to expand in the first and second directions, the second conductive layers are formed to extend in the first direction, and formed in a stripe pattern at a certain pitch in the second direction, and the third conductive layers are formed to extend in the second direction, and formed in a stripe pattern at a certain pitch in the first direction.

8. The non-volatile semiconductor storage device according to claim 7, wherein before applying the first voltage to the other end of the selected one of the first selection transistors, the control circuit applies a seventh voltage to the gate of an unselected one of the first selection transistors, and such a potential difference between the first voltage and the seventh voltage inhibits the occurrence of the first current.

9. The non-volatile semiconductor storage device according to claim 1, wherein the first semiconductor layer includes a p-type layer.

10. The non-volatile semiconductor storage device according to claim 1, wherein the control circuit identifies one of the memory transistors having a threshold voltage greater than a certain value, and performs the erase operation on an identified memory transistor to make the threshold voltage less than the certain value.

11. The non-volatile semiconductor storage device according to claim 1, wherein the first semiconductor layer comprises a joining portion joining bottom portions of a pair of the columnar portions.

* * * * *